(12) United States Patent
Kim et al.

(10) Patent No.: US 11,538,506 B2
(45) Date of Patent: Dec. 27, 2022

(54) SEMICONDUCTOR DEVICE AND SEMICONDUCTOR PACKAGE INCLUDING THE SEMICONDUCTOR DEVICE

(71) Applicant: Samsung Electronics Co., Ltd., Suwon-si (KR)

(72) Inventors: Hyungjin Kim, Uiwang-si (KR); Yongjun Kim, Hwaseong-si (KR); Yonghun Kim, Hwaseong-si (KR); Minsu Ahn, Suwon-si (KR); Reum Oh, Hwaseong-si (KR); Jinyong Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 31 days.

(21) Appl. No.: 17/356,080

(22) Filed: Jun. 23, 2021

(65) Prior Publication Data

US 2022/0028431 A1 Jan. 27, 2022

(30) Foreign Application Priority Data

Jul. 21, 2020 (KR) .......................... 10-2020-0090626
Nov. 25, 2020 (KR) .......................... 10-2020-0160445

(51) Int. Cl.
*G11C 5/06* (2006.01)
*G11C 5/02* (2006.01)
(Continued)

(52) U.S. Cl.
CPC .............. *G11C 5/06* (2013.01); *G11C 5/025* (2013.01); *H01L 23/5386* (2013.01); *H01L 25/0657* (2013.01)

(58) Field of Classification Search
CPC ........ G11C 5/06; G11C 5/025; H01L 23/5386; H01L 25/0657; H01L 25/0652; H01L 25/0655
See application file for complete search history.

(56) References Cited

U.S. PATENT DOCUMENTS 6,449,209 B1 9/2002 Lee
7,495,943 B2 * 2/2009 Takemura ........... G11C 11/4097
365/230.03
(Continued)

FOREIGN PATENT DOCUMENTS

CN 210837190 U 6/2020
TW 202011549 A 3/2020

OTHER PUBLICATIONS

First Office Action dated Jun. 2, 2022 by the Taiwan Intellectual Property Office for Corresponding TW Patent Application No. 110126473.

*Primary Examiner* — Tri M Hoang
(74) *Attorney, Agent, or Firm* — Muir Patent Law, PLLC

(57) ABSTRACT

A semiconductor device includes a cell area in which a plurality of memory cells are arranged in an array structure, and a peripheral area in which circuits configured to drive the memory cells are arranged, the peripheral area being next to the cell area. The cell area is divided into a plurality of banks, and the plurality of banks comprise first banks having a base size and second banks having a size of $1/(2*n)$ (wherein n is an integer greater than or equal to 1) of the base size. The plurality of banks are arranged in a first direction and a second direction perpendicular to the first direction, and the semiconductor device has a shape of a rectangular chip which is elongated in the second direction.

20 Claims, 21 Drawing Sheets

(51) Int. Cl.
*H01L 23/538* (2006.01)
*H01L 25/065* (2006.01)

(56) References Cited

U.S. PATENT DOCUMENTS

| | | | | |
|---|---|---|---|---|
| 7,788,619 | B2* | 8/2010 | Sim | G11C 8/10 |
| | | | | 716/122 |
| 7,817,470 | B2* | 10/2010 | Kim | G11C 7/1048 |
| | | | | 365/185.11 |
| 7,851,898 | B2 | 12/2010 | Nakamura et al. | |
| 8,134,879 | B2* | 3/2012 | Kim | G11C 29/785 |
| | | | | 365/225.7 |
| 8,179,733 | B2* | 5/2012 | Okuda | G11C 29/12005 |
| | | | | 365/189.08 |
| 8,755,837 | B2 | 6/2014 | Rhoads et al. | |
| 8,916,875 | B2 | 12/2014 | Lee | |
| 9,570,147 | B2* | 2/2017 | Kim | H01L 25/0657 |
| 10,861,812 | B2 | 12/2020 | Aoki | |
| 10,957,368 | B2* | 3/2021 | Futatsuyama | G11C 8/08 |
| 2004/0256641 | A1* | 12/2004 | Ahn | H01L 23/50 |
| | | | | 257/E23.079 |
| 2008/0080243 | A1 | 4/2008 | Edahiro et al. | |
| 2016/0071568 | A1* | 3/2016 | Sakai | G11C 7/1057 |
| | | | | 365/158 |
| 2018/0226331 | A1 | 8/2018 | Sarkar et al. | |
| 2018/0254261 | A1 | 9/2018 | Park | |
| 2019/0164578 | A1* | 5/2019 | Seo | H01L 23/544 |
| 2020/0082862 | A1* | 3/2020 | Kim | H01L 25/0657 |
| 2020/0265913 | A1 | 8/2020 | Kim et al. | |
| 2021/0313288 | A1* | 10/2021 | Oh | H01L 25/04 |
| 2021/0384160 | A1* | 12/2021 | Oh | H01L 25/18 |

* cited by examiner

SEMICONDUCTOR DEVICE AND SEMICONDUCTOR PACKAGE INCLUDING THE SEMICONDUCTOR DEVICE

CROSS-REFERENCE TO RELATED APPLICATIONS

This application is based on and claims priority under 35 U.S.C. § 119 to Korean Patent Application Nos. 10-2020-0090626, filed on Jul. 21, 2020, and 10-2020-0160445, filed on Nov. 25, 2020, in the Korean Intellectual Property Office, the disclosures of which are incorporated by reference herein in their entirety.

BACKGROUND

The inventive concept relates to a semiconductor device, and more particularly, to a semiconductor device including a cell area of a plurality of banks, and a semiconductor package including the semiconductor device.

Semiconductor devices, such as memory devices, are widely used to store information in various electronic devices such as computers, wireless communication devices, cameras, digital displays, or the like. Information may be stored by programming various states of a memory device. For example, the information may be stored in two states indicated by a logic "1" or a logic "0". A component of an electronic device may write or program a state in a memory device to store information, and may also read or sense a state stored in the memory device to access the stored information. Memory devices may be broadly classified into volatile memory devices and non-volatile memory devices. Regarding memory devices, research is constantly developing on increasing the density of memory cells, increasing the read/write speed, increasing reliability, increasing data retention, reducing power consumption, reducing manufacturing costs, and the like.

SUMMARY

Aspects of the inventive concept provide a semiconductor device including a cell area and a peripheral area of a bank structure suitable for a limited package size and also including a pad structure for easy testing and packaging, and a semiconductor package including the semiconductor device.

According to an aspect of the inventive concept, a semiconductor device includes a cell area, and at least two peripheral areas, and chip pads. In the cell area, a plurality of memory cells are arranged in an array structure. The at least two peripheral areas include circuits configured to drive the memory cells. The at least two peripheral areas are next to the cell area. The cell area is divided into a plurality of banks, wherein the plurality of banks include first banks having a first size and second banks having a size of $1/(2*n)$ (wherein n is an integer greater than or equal to 1) of the first size. The at least two peripheral areas each extend in a first direction and are directly adjacent to the plurality of banks. Chip pads are arranged in an "L" shape adjacent to an outer edge of a chip, and the semiconductor device has a shape of a rectangular chip which is elongated in a second direction perpendicular to the first direction.

According to another aspect of the inventive concept, a semiconductor device includes a cell area and a peripheral area. In the cell area, a plurality of memory cells are arranged in an array structure. In the peripheral area, which is next to the cell area, circuits are configured to drive the memory cells. The cell area is divided into a plurality of banks that include first banks having a base size and second banks having a size of $1/(2*n)$ (wherein n is an integer greater than or equal to 1) of the base size. The first and second banks are arranged in a first direction and a second direction perpendicular to the first direction, and the semiconductor device has a shape of a rectangular chip which is elongated in the second direction.

According to another aspect of the inventive concept, a semiconductor package includes a package substrate, a first stack structure, a second stack structure, and a sealing material. In the first stack structure, a plurality of chips are stacked, the first stack structure being mounted on the package substrate. In the second stacked structure, a same number of chips as that of the first stack structure are stacked, the second stacked structure being mounted on the package substrate and arranged to be horizontally adjacent to the first stacked structure. The sealing material seals the first stacked structure and the second stacked structure on the package substrate. Each of the plurality of chips includes a cell area in which a plurality of memory cells are arranged in an array structure and a peripheral area in which circuits configured to drive the plurality of memory cells are arranged, the peripheral area being next to the cell area. The cell area is divided into a plurality of banks, the plurality of banks including first banks having a base size and second banks having a size of $1/(2*n)$ (wherein n is an integer greater than or equal to 1) of the base size. The first and second banks are arranged in a first direction and a second direction perpendicular to the first direction. Each chip of the plurality of chips has a shape of a rectangular chip which is elongated in the second direction.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
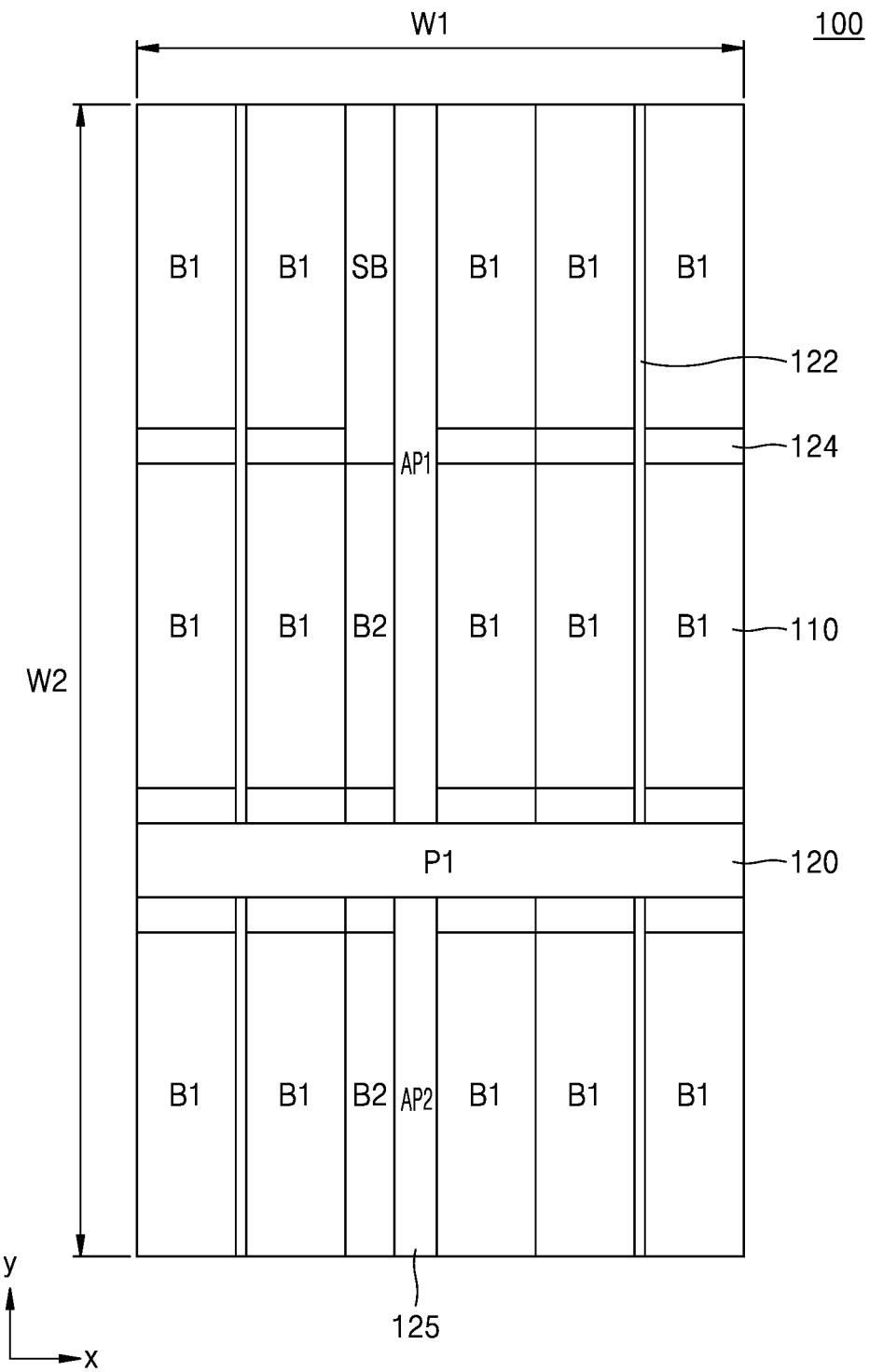
FIGS. 1A to 1D are plan views and conceptual diagrams of a semiconductor device including a cell area and a peripheral area according to an embodiment of the inventive concept.

Hereinafter, embodiments will be described in detail with reference to the accompanying drawings. In the drawings, like reference characters denote like elements, and redundant descriptions thereof will be omitted.

Figure 1B:
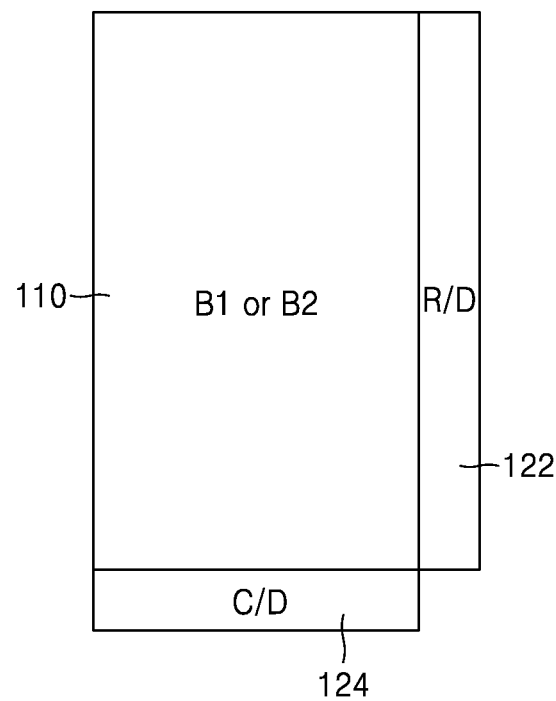
Figure 1C:
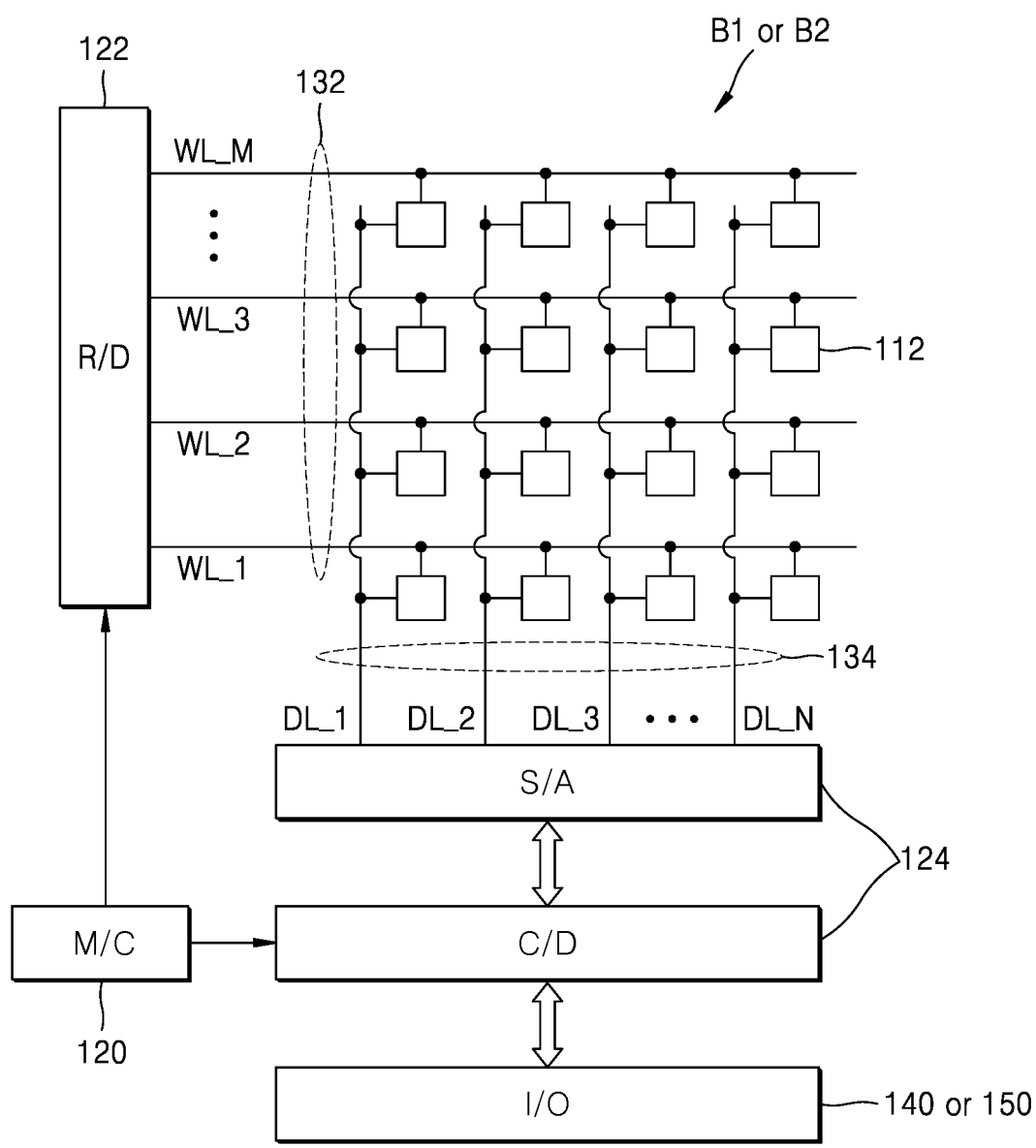
Figure 1D:
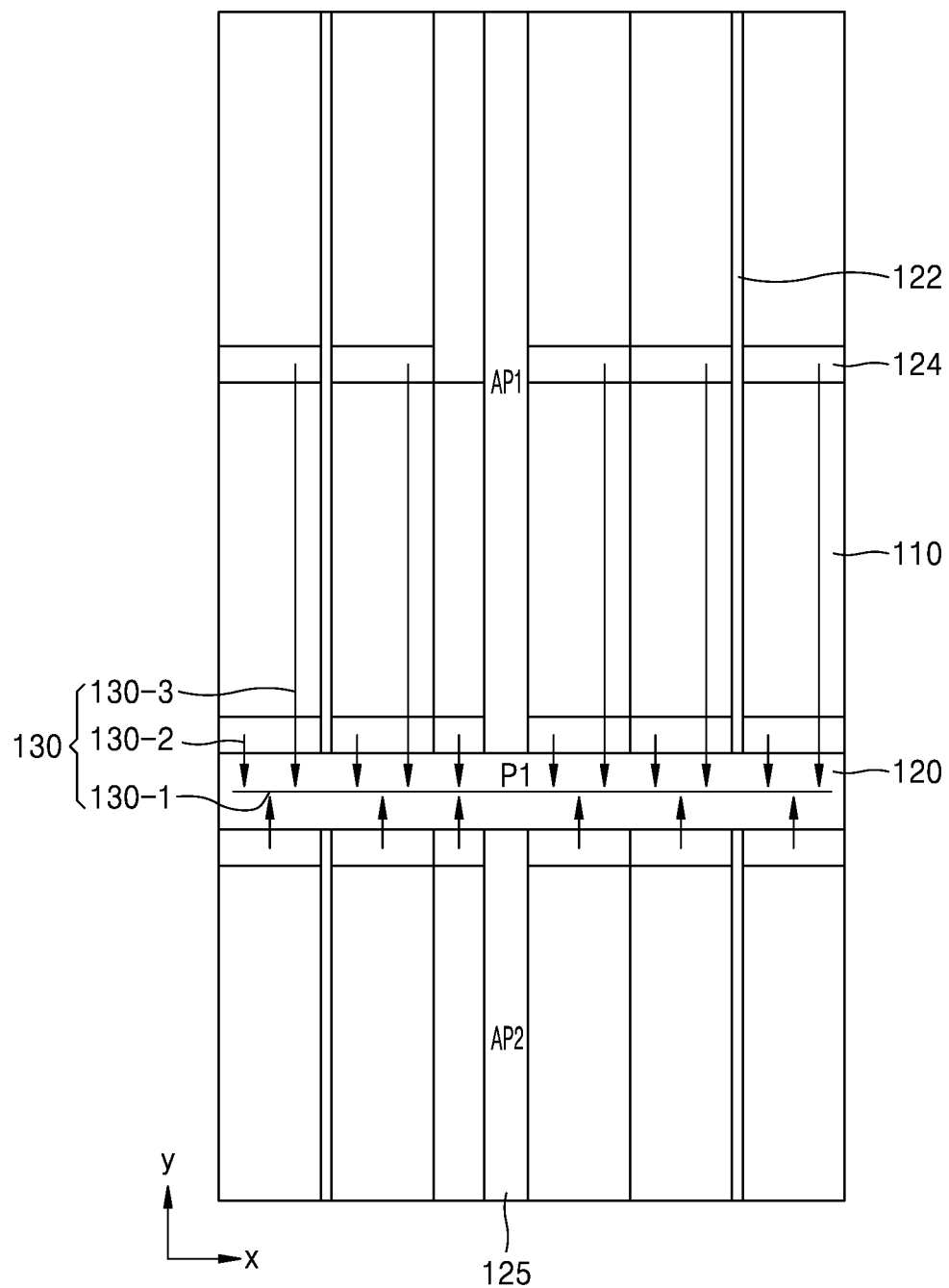

FIGS. 1A to 1D are plan views and conceptual diagrams of a semiconductor device including a cell area and a peripheral area according to an embodiment of the inventive concept, wherein FIG. 1B is a plan view of a portion of a bank in the semiconductor device of FIG. 1A, FIG. 1C is a conceptual diagram showing connection relationships between memory cells in the bank of FIG. 1B and peripheral circuits and/or core circuits, and FIG. 1D is a conceptual diagram showing a line structure for input/output of data in the semiconductor device of FIG. 1A.

Referring to FIGS. 1A to 1D, a semiconductor device 100 of the present embodiment may include a cell area 110 and a peripheral area 120.

A plurality of memory cells may be arranged in a two-dimensional array structure in the cell area 110. As shown in FIG. 1A, the cell area 110 may be divided into a plurality of banks B1 and B2, and the plurality of memory cells may be arranged in a two-dimensional array structure in each of the plurality of banks B1 and B2. The semiconductor device 100 may be classified into various memory devices according to a type of the memory cells arranged in the cell area 110. Field effect transistors (FET) such as planar FETs, FinFETs, or the like, and/or memory cells such as flash memory, dynamic random access memory (DRAM), static random access memory (SRAM), electrically erasable programmable read-only memory (EEPROM), phase-change random access memory (PRAM), magnetoresistive random access memory (MRAM), ferroelectric random access memory (FeRAM), resistive random access memory (RRAM), or the like may be arranged in the cell area 110, and accordingly, the semiconductor device 100 may be classified as a FET memory, flash memory, DRAM, SRAM, EEPROM, PRAM, MRAM, FeRAM, or PRAM device. The semiconductor device 100 of one example embodiment such as depicted in FIGS. 1A-1D may be a DRAM device, and accordingly, DRAM cells may be arranged in the cell area 110. However, the semiconductor device 100 is not limited to a DRAM device. Hereinafter, for convenience of explanation, the semiconductor device 100 will be mainly described as a DRAM device. The semiconductor device 100 may include a semiconductor substrate on which an integrated circuit including the various components described in connection with FIGS. 1A-1D and other figures are formed. The semiconductor device 100 may include various layers formed on the semiconductor substrate, including conductive (e.g., metal) layers and insulation layers, configured to transmit signals to and from the memory cells, logic circuits, and other components included in the semiconductor device 100.

In the semiconductor device 100 of FIGS. 1A-1D, the cell area 110 may include 17 banks B1 and B2. In addition, the banks B1 and B2 may include first banks B1 having a base size and second banks B2 having a size of ½ of the base size. The base size may refer to a standard or typical bank size used in semiconductor devices. Herein, the size may refer to a physical area, for example with respect to a plan view. In addition, the size may also or alternatively refer to the number of memory cells included in a bank, for example, the memory capacity of the bank. For example, in the semiconductor device 100 according to some embodiments, the first banks B1 and the second banks B2 may have the same size (e.g., length) in a second direction (y direction), and when the first banks B1 have a size (e.g., length) of '1' in a first direction (x direction), the second bank B2 may have a size (e.g., length) of '½' in the first direction. In terms of memory capacity, when the semiconductor device 100 has a memory capacity of 16 gigabits (Gb) or 2 gigabytes (GB), each of the first banks B1 may have a memory capacity of 1 Gb, and each of the second banks B2 may have a memory capacity of 0.5 Gb. A bank may include an array of memory cells that are controlled using a particular peripheral circuit including a row decoder and column decoder. Different memory banks may be connected to different sets of conductive lines connected respectively to different row decoders and column decoders.

In the semiconductor device 100 of the various embodiments, the size of the second bank B2 is not limited to a size of ½ of the size of the first banks B1. For example, according to an embodiment, the second bank B2 may have a size of ¼, ⅛, or the like of the size of the first bank B1. For example, the second bank B2 may have a size of 1/(2*n) (wherein n is an integer greater than or equal to one) of the size of the first bank B1. In addition, according to embodiments, the second banks B2 may also include banks having different sizes from each other. For example, the second banks B2 may include a bank having a size of ½ of the size of the first bank B1 and a bank having a size of ¼ of the size of the first bank B1. However, the total size of the second banks B2 may be an integer multiple of the size of the first bank B1. For example, the second banks B2 may include one bank having a size of ½ of the size of first bank B1 and two banks having a size of ¼ of the size of the first bank B1, and the total size of the second banks B2 may be the same as the size of one first bank B1.

In the semiconductor device 100 of the present embodiment, fifteen first banks B1 and two second banks B2 are arranged in the cell area 110, as shown in FIG. 1A. Five first banks B1 are arranged in the first direction (x direction) and three first banks B1 are arranged in the second direction (y direction). In addition, two second banks may be arranged in the second direction (y direction). In detail, the second banks B2 may be arranged adjacent to the right side of the first banks B1 at the second position in the first direction (x direction). In addition, the second banks B2 may be arranged at the first and second positions from the bottom in the second direction (y direction). As can be seen, five first banks B1 are arranged in each of three sequentially-arranged rows, each row extending in the first direction (x direction), and three first banks B1 are arranged in each of five columns, each column extending in the second direction (y direction). Further, the two second banks B2 are each arranged between two of the first banks B1 in the first direction (x direction), wherein one of the two second banks B2 is in a first row of the three sequentially-arranged rows, and another of the two second banks B2 is in a second row of the three sequentially-arranged rows.

In the semiconductor device 100 according to some embodiments, arrangement structures of the first banks B1 and the second banks B2 are not limited to the arrangement structures of FIG. 1A. For example, according to an embodiment, the second banks B2 may be arranged at the first and third positions or the second and third positions from the bottom in the second direction (y direction). In addition, when a certain width of a first core area 122 in the first direction (x direction) is secured, the second banks B2 may be arranged at any position in the first direction (x direction).

The peripheral area 120 may be arranged next to the cell area 110. In detail, the peripheral area 120 may be arranged between a first row including banks B1 and B2 at the first position in the second direction (y direction) and a second row including banks B1 and B2 at the second position from the bottom in the second direction (y direction), and may extend in the first direction (x direction). Peripheral circuits for operations of memory cells and/or a core circuit for calculations and the like may be arranged in the peripheral area 120. In the semiconductor device 100 of the present embodiment, the peripheral area 120 may include one peripheral area, for example, a first peripheral area P1.

Core areas 122 and 124 may be arranged adjacent to the banks B1 and B2 of the cell area 110. Peripheral circuits for input/output of data or commands, or input of power/ground may be arranged in the peripheral area 120, and core circuits performing operations like a decoder may be arranged in the core areas 122 and 124. According to an embodiment, all of the remaining areas except for the cell area 110 may be referred to as a peripheral area or a core-peripheral area. In the semiconductor device 100 of the present embodiment, the peripheral area 120 and the core areas 122 and 124 may be used separately. The peripheral circuits and the core circuits arranged in the peripheral area 120 and the core areas 122 and 124 will be described in more detail below with reference to FIGS. 1B and 1C.

In the semiconductor device 100 of the present embodiment, an additional peripheral area 125 may be further arranged around the cell area 110. The additional peripheral area 125 may be arranged between the second bank B2 and the first bank B1 at the third position from the left in the first direction (x direction), and may extend in the second direction (y direction). Peripheral circuits, core circuits, lines, or the like may be arranged in the additional peripheral area 125. For example, core circuits for the banks B1 and B2 may be arranged in the additional peripheral area 125. The additional peripheral area 125 may include a first additional peripheral area AP1 on the peripheral area 120 in the second direction (y direction) and a second additional peripheral area AP2 below the peripheral area 120. According to an embodiment, redistributions connecting lines in the peripheral area 120 to first pads (140 of FIG. 4) on outer portion of a chip may be arranged in the second additional peripheral area AP2.

In the position in which the second bank B2 is arranged in the first direction (x direction), a similar bank area SB may be arranged at the third position from the bottom in the second direction (y direction). The physical size of the similar bank area SB may be substantially the same as the second bank B2. However, devices other than memory cells may be arranged in the similar bank area SB. For example, a device such as an anti-fuse or a direct current (DC) generator may be arranged in the similar bank area SB. Devices arranged in the similar bank area SB are not limited to the above-stated devices. Terms such as "same," "equal," "planar," "coplanar," "parallel," and "perpendicular," as used herein encompass identically or near identically including variations that may occur, for example, due to manufacturing processes. The term "substantially" may be used herein to emphasize this meaning, unless the context or other statements indicate otherwise.

Referring to FIG. 1B, the core areas 122 and 124 may be arranged around a bank B1 or B2. The core areas 122 and 124 may be divided into the first core area 122 extending in the second direction (y direction) and a second core area 124 extending in the first direction (x direction). A row decoder R/D may be arranged in the first core area 122, and a column decoder C/D may be arranged in the second core area 124. The row decoder R/D is also referred to as an X-decoder. A sense amplifier S/A together with the column decoder C/D may be arranged in the second core area 124.

Referring to FIG. 1C, connection relationships and operations between memory cells of a bank B1 or B2 and the peripheral circuits and/or core circuits arranged around the bank B1 or B2 will be described in more detail below, wherein word lines 132 and bit lines 134 for operations such as reading and writing to memory cells may be arranged to be connected to memory cells 112. For example, the word lines 132 may extend in the first direction (x direction), and the bit lines 134 may extend in the second direction (y direction). The word lines 132 and the bit lines 134 may include or be formed of, for example, a metal such as copper (Cu), aluminum (Al), gold (Au), tungsten (W), or the like. However, materials of the word lines 132 and the bit lines 134 are not limited to metal. For example, the word lines 132 and the bit lines 134 may include a conductive material such as a metal alloy, carbon, a semiconductor doped with impurities, other conductive compounds, or the like, and the word lines 132 may be formed of the same material as the bit lines 134 or a different material.

Each row of the memory cells 112 may be connected to one of the word lines 132. In addition, each column of the memory cells 112 may be connected to one of the bit lines 134. By activating one word line 132 and one bit line 134, for example, by applying a voltage to the one word line 132 and the one bit line 134, one of the memory cells 112 corresponding to an intersection point of the one word line 132 and the one bit line 134 may be accessed. Accessing to the memory cell 112 may include reading the memory cell 112 or writing to the memory cell 112. The intersection point of the word line 132 and the bit line 134 may be referred to as an address of the memory cell 112.

The access of the memory cell 112 with a DRAM device will be briefly described below. A logic storage device of the memory cell 112, for example, a capacitor, may be electrically insulated from the bit line 134 through a transistor. The word line 132 may be connected to the transistor and may control the transistor. For example, the word line 132 may be connected to a gate of the transistor. With this connection structure, when the word line 132 is activated, an electrical circuit or a closed circuit may be formed between the capacitor of the memory cell 112 and the bit line 134 corresponding thereto, and then the memory cell 112 may be accessed through the bit line 134 to read or write to the memory cell 112.

Accessing to the memory cell 112 may be controlled by the row decoder R/D and the column decoder C/D. For example, the row decoder R/D may receive a row address from a memory controller M/C and activate an appropriate word line 132 based on the received row address. Similarly, the column decoder C/D may receive a column address from the memory controller M/C and activate an appropriate bit line 134 based on the received column address. For example, the memory controller M/C may be arranged in the peripheral area 120.

As described above, the row decoder R/D and the column decoder C/D may be respectively arranged in the core areas 122 and 124 to be adjacent to the bank B1 or B2. Accordingly, the row decoder R/D and the column decoder C/D may respectively receive a row address and a column address of the memory cell 112 located in the bank B1 or B2. For example, the bank B1 or B2 may include a plurality word lines 132 indicated by WL_1 to WL_M and a plurality of bit lines 134 indicated by DL_1 to DL_N, wherein M and N may depend on an array size of the bank B1 or B2. Accordingly, by activating the one of the plurality of word lines 132 and the one of the plurality of bit lines 134, for example, WL_2 and DL_3, the memory cell 112 at an intersection point of WL_2 and DL_3 may be accessed. A different bank will have a different row decoder and column decoder circuit arranged adjacent to that different bank.

When the memory cell 112 is accessed, the memory cell 112 may be read or sensed by the sense amplifier S/A to determine a stored state of the memory cell 112. For example, after the memory cell 112 is accessed, the capacitor of the memory cell 112 may be discharged to the corresponding bit line 134. The discharge may cause a change in voltage of the bit line 134, and the sense amplifier S/A may determine the stored state of the memory cell 112 by comparing the changed voltage of the bit line 134 with a reference voltage.

As described above, the sense amplifier S/A may be arranged in the second core area 124 together with the column decoder C/D. The sense amplifier S/A may include various transistors or amplifiers for detecting and amplifying a difference in signal. A detected logic state of the memory cell 112 may be output through the column decoder C/D and an input/output unit I/O. According to an embodiment, the sense amplifier S/A may be treated as a portion of the column decoder C/D. The input/output unit I/O may include first and second pads (refer to 140 and 150 of FIG. 4) for input/output of data and commands, power/ground input, or the like.

The memory controller M/C may control operations of the memory cells 112 through various components, for example, the row decoder R/D, the column decoder C/D, the sense amplifier S/A, or the like. The operations of the memory cells 112 may include, for example, operations of reading, writing, rewriting, refreshing, discharging, or the like. The memory controller M/C may generate a row address signal and a column address signal to activate the word lines 132 and the bit lines 134. In addition, the memory controller M/C may generate and control various voltages or currents used for the operations of the memory cell 112. The memory controller M/C may communicate commands, data, and other information with a host device.

In the semiconductor device 100 according to some embodiments, input/output of data to/from the memory cell 112 in the bank B1 or B2 may be performed through the following operations. Data from the memory cell 112 may be output by being transferred to the peripheral area 120 through the second core area 124 of a corresponding bank and then being transferred to the first pads (see 140 of FIG. 4) for input/output arranged on outer portion of a chip through the redistributions in the peripheral area 120. On the contrary, data from the first pads 140 for input/output may be input by being transferred to the memory cell 112 of a corresponding bank through the redistributions, the peripheral area 120, and the second core area 124 of the corresponding bank. Herein, output of data may refer to reading of data, and input of data may refer to writing or storage of data.

Referring to FIG. 1D, a line 130 may include a first line 130-1, a second line 130-2, and a third line 130-3. The first line 130-1 may be arranged in the peripheral area 120. The second line 130-2 (e.g., a plurality of lines) may connect circuits in the second core area 124 in the banks B1 and B2 at the first and second positions in the second direction (y direction) to the first line 130-1 in the peripheral area 120. The third line 130-3 (e.g., a plurality of lines) may connect the circuits in the second core area 124 in the first banks B1 at the third position in the second direction (y direction) to the first line 130-1 in the peripheral area 120. The second core areas 124 of the first banks B1 at the third position in the second direction (y direction) may be relatively far from the peripheral area 120 compared with the second core areas 124 of the banks B1 and B2 at the first and second positions in the second direction (y direction), and accordingly, the second line 130-2 may be shorter than the third line 130-3. It should be noted that throughout the specification and claims, ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Based on the structure of the line 130, input/output of data to/from the memory cells 112 of the first banks B1 at the third position in the second direction (y direction) by using the third line 130-3 which is relatively long may be slower than input/output of data to/from the memory cells 112 of the banks B1 and B2 at the first and second positions in the second direction (y direction) by using the second line 130-2 which is short in comparison. In addition, the third line 130-3 may be arranged to pass through the banks B1 and B2 at the second position in the second direction (y direction). In addition, in the case of the second banks B2, considering a distance between the second core area 124 and the peripheral area 120, and a length of a corresponding line, the second banks B2 may be arranged at the first and second positions in the second direction (y direction). Also, the peripheral area 120 may be arranged between the second bank B2 at the first position in the second direction (y direction) and the second bank B2 at the second position in the second direction (y direction).

As shown in FIG. 1A, the semiconductor device 100 of the present embodiment may have a shape of a rectangular chip which is long (e.g., extends lengthwise) in the second direction (y direction). The chip may be formed on a die from a wafer, and the outer boundaries depicted in FIG. 1A may correspond to outer edges of the die. The rectangular chip may have a first width W1 in the first direction (x direction) and a second width W2 in the second direction (y direction). For example, the first width W1 may be 5.7 mm or less, and the second width W2 may be 10.92 mm or less. However, the first width W1 and the second width W2 are not limited to the numerical values set forth above. When forming a semiconductor package with the semiconductor device 100 of the present embodiment, one semiconductor device 100 (e.g., chip) may be mounted on a package substrate and covered with an encapsulation layer, or in some embodiments two or more semiconductor devices 100 (e.g., chips) may be mounted on a package substrate (see 200 of 8A) and be covered with an encapsulation layer, so that the two or more semiconductor devices 100 are adjacent to each other in the first direction (X direction), based on the size of the above-described chip. In addition, a plurality of semiconductor devices 100 may be stacked in a third direction perpendicular to an x-y plane to form stacked structures (refer to 100S1 and 100S2 of FIG. 8A). Similar to the semiconductor device 100, two stacked structures 100S1 and 100S2 may be mounted on the package substrate 200 to be adjacent to each other in the first direction (x direction) to form a semiconductor package. A semiconductor package including the semiconductor device 100 according to certain embodiments will be described in more detail below with reference to FIGS. 8A, 8B, 9A, 9B, 10A, and 10B.

In the semiconductor device 100 of the present embodiment, as the second banks B2 have various sizes, various bank structures may be formed in the cell area 110 by combining the first banks B1 and the second banks B2. For reference, when a semiconductor device includes only the first banks B1 having the base size, the bank structure in the cell area 110 is limited. For example, when the 16 Gb semiconductor device 100 (e.g., chip) includes only the first banks B1 having the base size of 1 Gb, sixteen first banks B1 may be included in the cell area 110, and only arrangement structures of 1*16, 2*8, and 4*4 may be possible. On the contrary, when the 16 Gb semiconductor device 100 (e.g., a chip) includes the first banks B1 having the base size of 1 Gb and the second banks B2 having the size of 0.5 Gb, which is ½ of the size of the first bank B1, fifteen first banks B1 and two second banks B2 may be included in the cell area 110, and an arrangement structure such as 3*5+0.5*2 may be possible. The bank structure in the cell area 110 may be more variously changed based on various sizes of the second banks B2.

The semiconductor device 100 of certain embodiments such as shown in FIGS. 1A-1D may have a shape of a rectangular chip which is elongated in the second direction (y direction), and may form a stacked structure in which a plurality of semiconductor devices 100 are stacked. In addition, based on the shape of the rectangular chip, two stacked structures may be mounted on the package substrate 200 to be adjacent to each other to form a semiconductor package, and the semiconductor package may have a significantly increased memory capacity while satisfying the standard of a package size of the Joint Electron Device Engineering Council (JEDEC).

FIGS. 2A, 2B, 3A, and 3B are plan views of semiconductor devices including cell areas and peripheral areas according to an embodiment of the inventive concept. The description of components of the present embodiment that are the same as those described with reference to FIGS. 1A to 1D will be omitted or briefly presented.

Figure 2A:
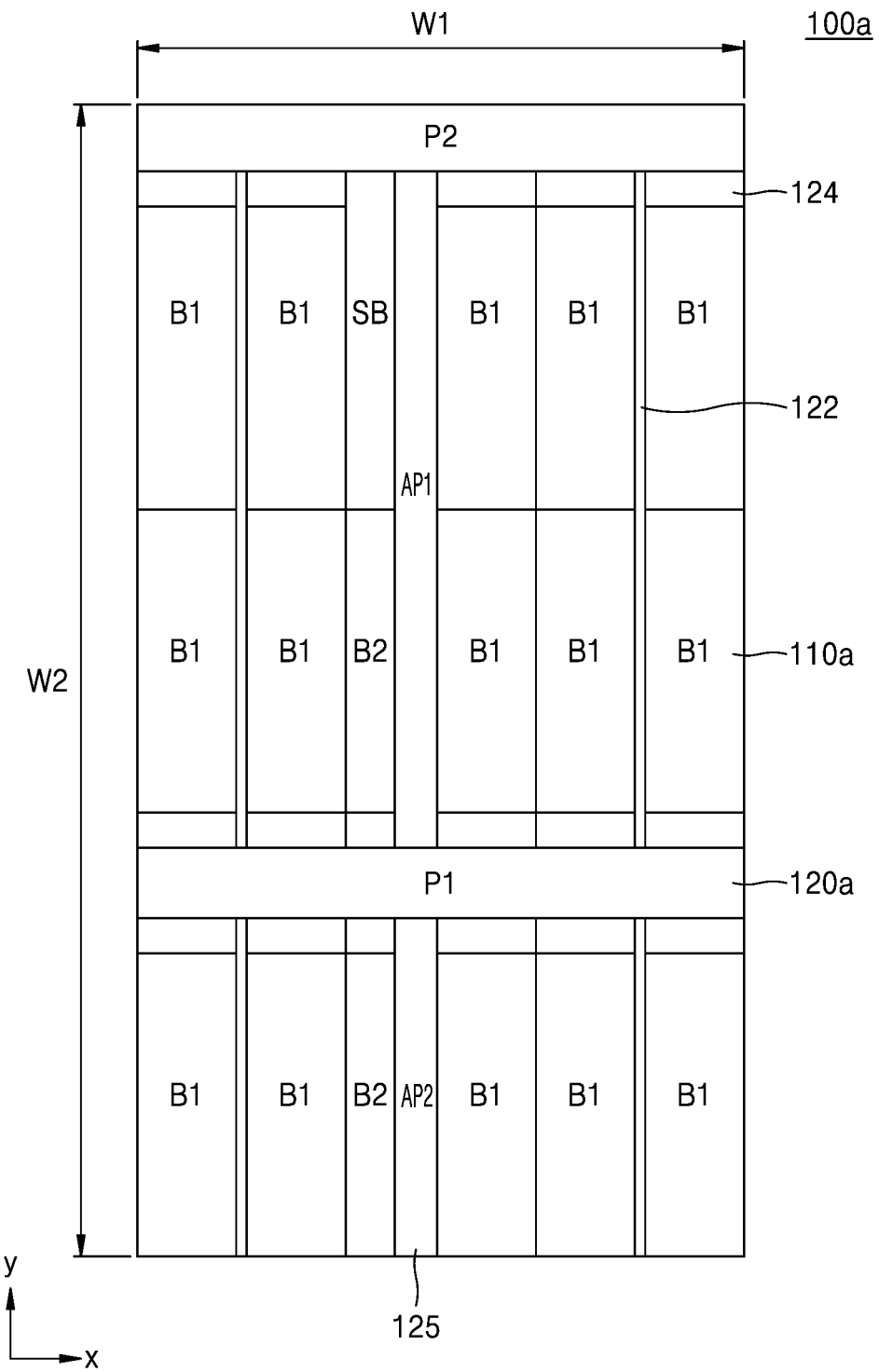
FIGS. 2A, 2B, 3A, and 3B are plan views of semiconductor devices including cell areas and peripheral areas according to an embodiment of the inventive concept.
Figure 2B:
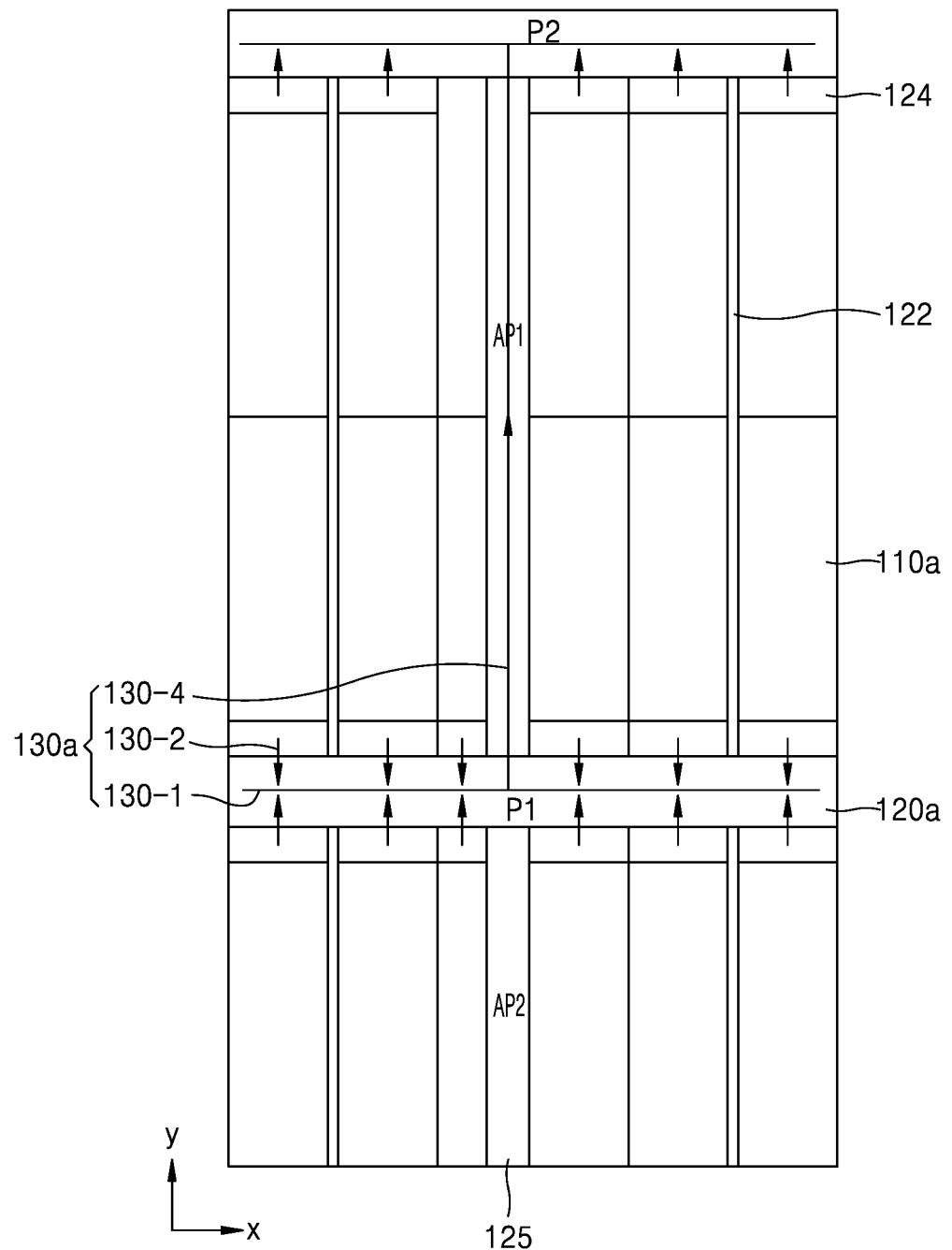

Referring to FIGS. 2A and 2B, a semiconductor device 100a of the present embodiment may be different from the semiconductor device 100 of FIG. 1A in a structure of a peripheral area 120a and a structure of the first bank B1 in the cell area 110a corresponding thereto. In detail, in the semiconductor device 100a of the present embodiment, the peripheral area 120a may include a first peripheral area P1 and a second peripheral area P2. The first peripheral area P1 may be substantially the same as the first peripheral area P1 of the semiconductor device 100 of FIG. 1A. Accordingly, the first peripheral area P1 may be arranged between the set of banks B1 and B2 at the first position in the second direction (y direction) and the set of banks B1 and B2 at the second position in the second direction (y direction), and may extend in the first direction (x direction).

The second peripheral area P2 may be arranged at the outermost side of the semiconductor device 100a in the second direction (y direction), and may extend in the first direction (x direction). For example, the second peripheral area P2 may be arranged outside the first bank B1 at the third position in the second direction (y direction). In addition, the banks B1 and B2 at the second position in the second direction (y direction) and the first banks B1 at the third position in the second direction (y direction) may be arranged between the first peripheral area P1 and the second peripheral area P2.

As the second peripheral area P2 is arranged in an outer portion of the semiconductor device 100a in the second direction (y direction), the second core areas 124 of the first banks B1 at the third position in the second direction (y direction) may be arranged on an upper side of the first banks B1 For example, the second core areas 124 of the first banks B1 at the third position in the second direction (y direction) may be arranged between the first banks B1 at the third position in the second direction (y direction) and the second peripheral area P2. As can be seen, the first peripheral area P1 is between a first row including a first set of first banks B1 and one second bank B2 arranged in the first direction (x direction) and a second row including a second set of first banks B1 and one second bank B2 arranged in the first direction (x direction). The second peripheral area P2 is outside the first banks B1 with respect to the second direction (y direction). In addition, the plurality of banks in the second row and a plurality of banks in a third row of the three sequentially-arranged rows are between the first peripheral P1 area and the second peripheral area P2.

Referring to FIG. 2B, a line 130a may include first lines 130-1, second lines 130-2, and fourth lines 130-4. The first lines 130-1 may be arranged in the peripheral area 120a. The second lines 130-2 may connect circuits in the second core areas 124 of the banks B1 and B2 at the first to third positions in the second direction (y direction) to the first lines 130-1 in the peripheral area 120a. In more detail, the second lines 130-2 may connect circuits in the second core areas 124 of the banks B1 and B2 at the first and second positions in the second direction (y direction) to the first line 130-1 in the first peripheral area P1, and may also connect circuits in the second core areas 124 of the first banks B1 at the third position in the second direction (y direction) to the first line 130-1 of the second peripheral area P2. The fourth line 130-4 may connect the first line 130-1 in the first peripheral area P1 to a first line 130-1 in the second peripheral area P2. The fourth line 130-4 may be arranged in the first additional peripheral area AP1.

In the semiconductor device 100a of the present embodiment, input/output of data to/from the memory cells 112 in the banks B1 and B2 may be performed through the following operations. Data from the memory cells 112 of the banks B1 and B2 at the first and second positions in the second direction (y direction) may be output by being transferred to the first peripheral area P1 through the second core area 124 of a corresponding bank and then being transferred from the first peripheral area P1 to the first pads (see 140 of FIG. 40) for input/output arranged in the second peripheral area P2 through the fourth line 130-4. In addition, data from the memory cells 112 of the first banks B1 at the third position in the second direction (y direction) may be output by being transferred to the second peripheral area P2 through the second core area 124 of a corresponding bank and then being directly transferred to the first pads 140 for input/output arranged in the second peripheral area P2. On the contrary, data from the pads 140 for input/output may be input by being transferred to the memory cell 112 of a corresponding bank through the second peripheral area P2, the first peripheral area P1, and the second core area 124 of the corresponding bank or being transferred to the memory cell 112 of a corresponding bank through the second peripheral area P2 and the second core area 124 of the corresponding bank. Though one first line 130-1 and one second line 130-2 are depicted each as a single line, in various embodiments, these lines each represent a plurality of lines.

In the semiconductor device 100a of the present embodiment, the second peripheral area P2 may be further arranged outside the first banks B1 at the third position in the second direction (y direction), and the second core areas 124 of the first banks B1 at the third position in the second direction (y direction) may be arranged to be directly adjacent to the second peripheral area P2. Accordingly, the third line 130-3 extending lengthwise through the banks B1 and B2 as in the semiconductor device 100 of FIG. 1A may not exist. In addition, because the fourth line 130-4 is arranged in the first additional peripheral area AP1, a situations requiring a separate line area or lines passing through a bank may not occur. Further, in the semiconductor device 100*a* of the present embodiment, the first pads 140 for input/output may be arranged in the second peripheral area P2, and accordingly, the first line 130-1 of the second peripheral area P2 may be directly connected to the first pads 140 for input/output, and thus, redistributions that may be needed for the semiconductor device 100 of FIG. 1A may be unnecessary. As a result, the semiconductor device 100*a* of the present embodiment can efficiently and quickly input/output data to/from the memory cells 112 based on the structure of the peripheral area 120*a* and the structures of the banks B1 and B2 of the cell area 110*a*.

The semiconductor device 100*a* of the present embodiment may also have a shape of a rectangular chip that is elongated in the second direction (y direction). The rectangular chip may have a first width, for example, of 5.7 mm or less in the first direction (x direction) and a second width W2 of 10.92 mm or less in the second direction (y direction). However, the first width W1 and the second width W2 are not limited to the numerical values set forth above. Because the semiconductor device 100*a* of the present embodiment further includes the second peripheral area P2, at least one of the banks B1 and B2 and the second core area 124 may have a smaller width in the second direction (y direction), compared to the semiconductor device 100 of FIG. 1A.

Figure 3A:
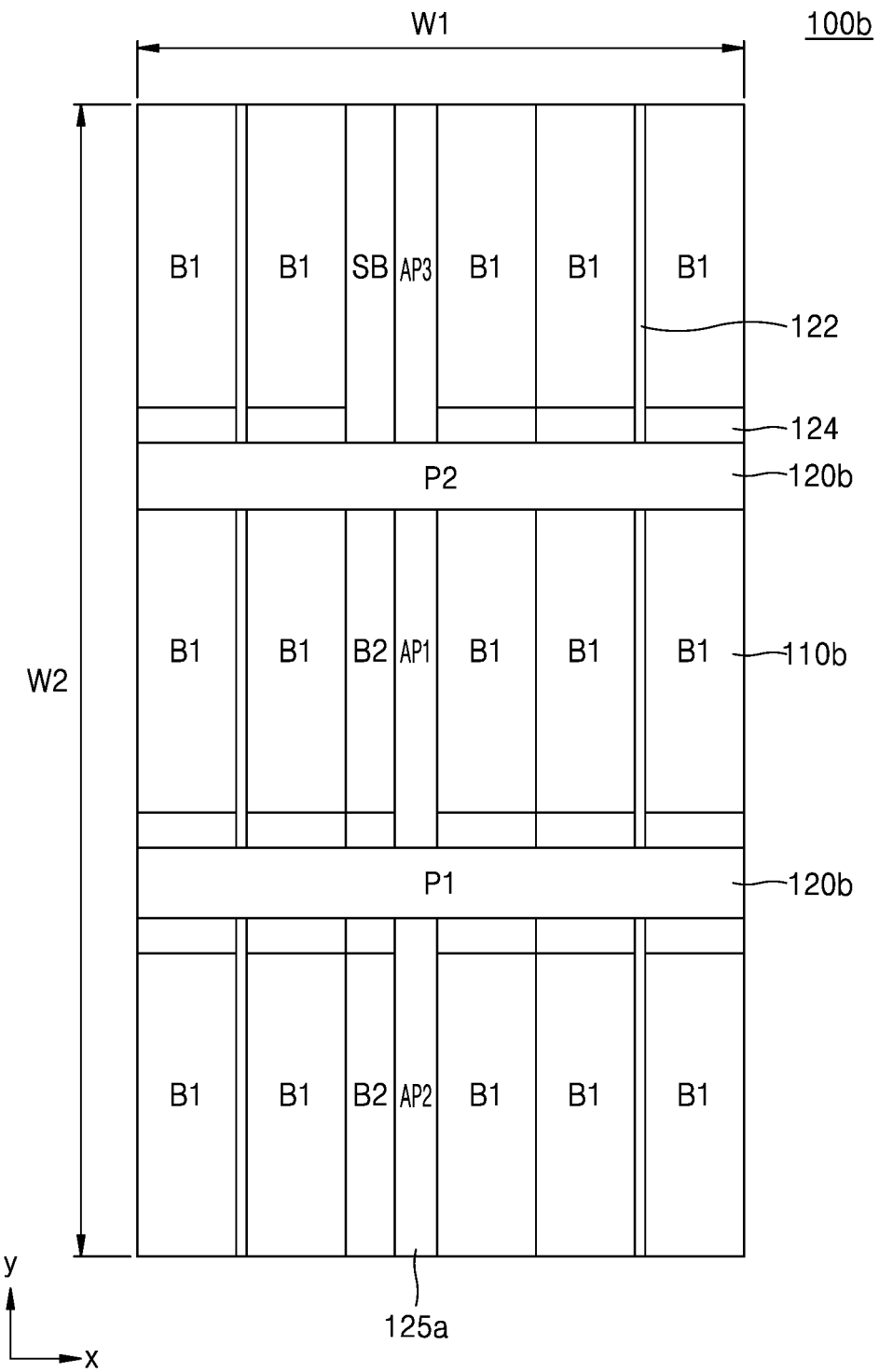
Figure 3B:
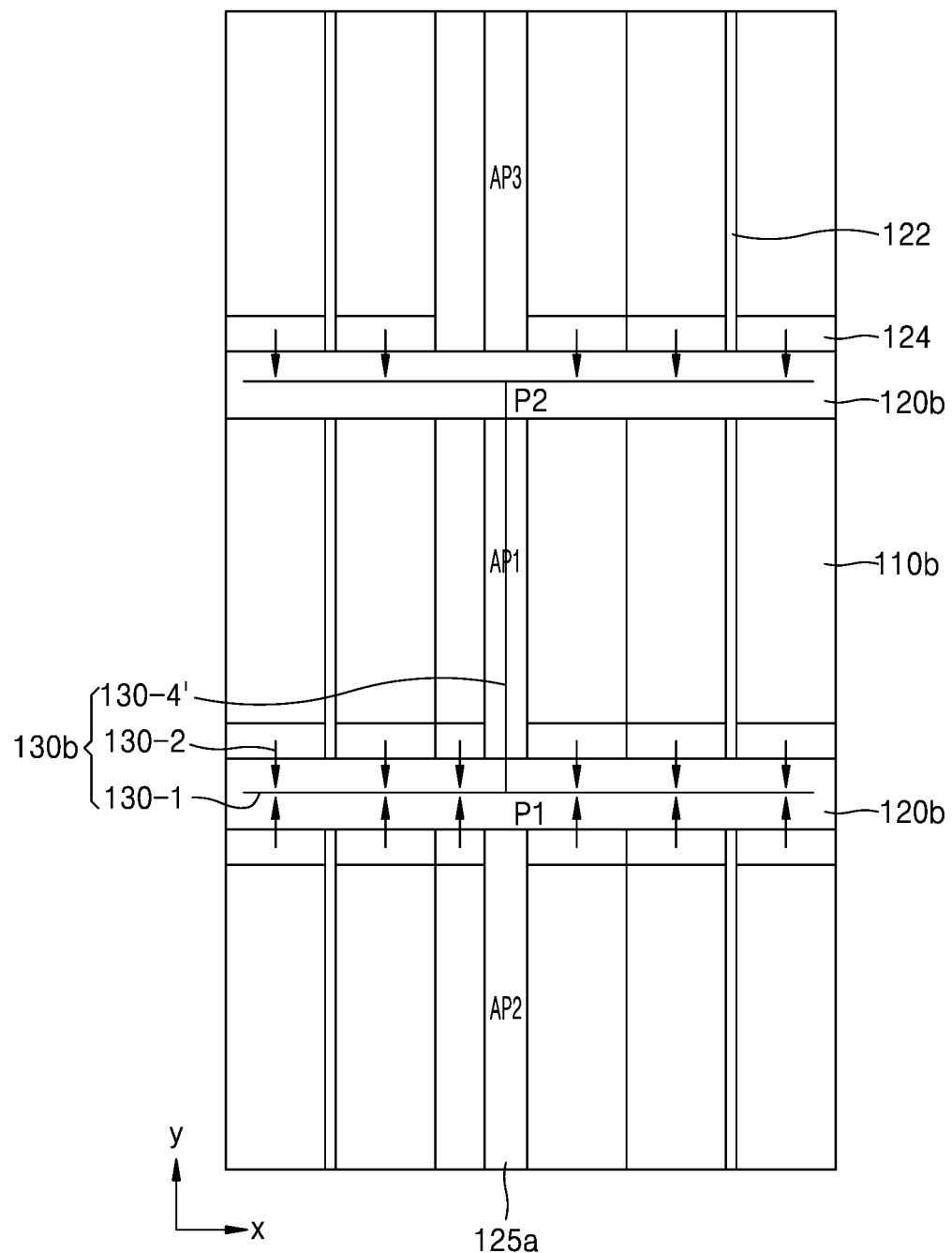

Referring to FIGS. 3A and 3B, a semiconductor device 100*b* of the present embodiment may be different from the semiconductor device 100*a* of FIG. 2A in a structure of the peripheral area 120*b* and a structure of the first bank B1 in the cell area 110*b* corresponding thereto. In detail, in the semiconductor device 100*b* of the present embodiment, similar to the semiconductor device 100*a* of FIG. 2A, the peripheral area 120*b* may include a first peripheral area P1 and a second peripheral area P2. The first peripheral area P1 may be substantially the same as the first peripheral area P1 of the semiconductor device 100*a* of FIG. 2A. Accordingly, the first peripheral area P1 may be arranged between the banks B1 and B2 at the first position in the second direction (y direction) and the banks B1 and B2 at the second position in the second direction (y direction), and may extend in the first direction (x direction).

However, unlike the semiconductor device 100*a* of FIG. 2A, the second peripheral area P2 may be arranged between the banks B1 and B2 at the second position in the second direction (y direction) and the first banks B1 at the third position in the second direction (y direction), and may extend in the first direction (x direction). In addition, the banks B1 and B2 at the second position in the second direction (y direction) may be arranged between the first peripheral area P1 and the second peripheral area P2.

As the second peripheral area P2 is arranged between the banks B1 and B2 at the second position in the second direction (y direction) and the first banks B1 at the third position in the second direction (y direction), the second core areas 124 of the first banks B1 at the third position in the second direction (y direction) may be arranged on a lower side of the first banks B1 For example, the second core areas 124 of the first banks B1 at the third position in the second direction (y direction) may be arranged between the first bank B1 at the third position in the second direction (y direction) and the second peripheral area P2.

Referring to FIG. 3B, a line 130*b* may include first lines 130-1, a second lines 130-2, and a fourth line 130-4'. The first lines 130-1 may be arranged in the peripheral area 120*b*.

The second lines 130-2 may connect circuits in the second core areas 124 of the banks B1 and B2 at the first to third positions in the second direction (y direction) to the first lines 130-1 in the peripheral area 120*b*. In more detail, the second lines 130-2 may connect circuits in the second core areas 124 of the banks B1 and B2 at the first and second positions in the second direction (y direction) to the first line 130-1 in the first peripheral area P1, and may also connect circuits in the second core areas 124 of the first banks B1 at the third position in the second direction (y direction) to the first line 130-1 of the second peripheral area P2. The fourth line 130-4' may connect the first line 130-1 in the first peripheral area P1 to the first line 130-1 in the second peripheral area P2. The fourth line 130-4' may be arranged in the first additional peripheral area AP1.

In the semiconductor device 100*b* of the present embodiment, an additional peripheral area 125*a* may include first to third additional peripheral areas AP1, AP2, and AP3. The first additional peripheral area AP1 may be arranged between the second bank B2 and the first bank B1 at the third position from the left in the first direction (x direction), arranged in a portion corresponding to the banks B1 and B2 at the second position in the second direction (y direction), and extend in the second direction (y direction). The second additional peripheral area AP2 may be arranged between the second bank B2 and the first bank B1 at the third position from the left in the first direction (x direction), arranged in a portion corresponding to the banks B1 and B2 at the first position in the second direction (y direction), extend in the second direction (y direction). The third additional peripheral area AP3 may be arranged between a similar bank area SB and the first bank B1 at the third position from the left in the first direction (x direction), arranged in a portion corresponding to the first banks B1 at the third position in the second direction (y direction), and extend in the second direction (y direction).

In the semiconductor device 100*b* of the present embodiment, input/output of data to/from the memory cells 112 in the banks B1 and B2 may be performed through the following operations. Data from the memory cells 112 of the plurality of banks B1 and B2 at the first and second positions in the second direction (y direction) may be output by being transferred to the first peripheral area P1 through the second core area 124 of a corresponding bank and then being transferred from the first peripheral area P1 to the first pads 140 for input/output arranged on outer portion of a chip through the redistribution. In addition, data from the memory cells 112 of the first banks B1 at the third position in the second direction (y direction) may be output by being transferred to the second peripheral area P2 through the second core area 124 of a corresponding bank, transferred to the first peripheral area P1 through the fourth line 130-4' and then being transferred to the first pads 140 for input/output from the first peripheral area P1 through the redistribution. On the contrary, data from the first pads 140 for input/output may be input by being transferred to the memory cell 112 of a corresponding bank through the redistribution, the first peripheral area P1 and the second core area 124 of the corresponding bank or being transferred to the memory cell 112 of the corresponding bank through the redistribution, the first peripheral area P1, the second peripheral area P2, and the second core area 124 of the corresponding bank.

In the semiconductor device 100*b* of the present embodiment, the second peripheral area P2 may be further arranged between the plurality of banks B1 and B2 at the second position in the second direction (y direction) and the first banks B1 at the third position in the second direction (y direction), and the second core areas 124 of the first banks B1 at the third position in the second direction (y direction) may be arranged directly adjacent to the second peripheral area P2. Accordingly, the third line 130-3 extending long through the banks B1 and B2 as in the semiconductor device 100 of FIG. 1A may not exist. In addition, because the fourth line 130-4' is arranged in the first additional peripheral area AP1, a separate line area is not required and lines do not need to pass through a bank. As a result, in the semiconductor device 100b of the present embodiment, it is very efficient and fast to input/output data to/from the memory cell 112 based on the structure of the peripheral area 120b and the structures of the banks B1 and B2 of the cell area 110b.

In the semiconductor device 100b of the present embodiment, compared with the semiconductor device 100a of FIG. 2A, because only the positions of the second peripheral area P2 and the second core areas 124 of the first banks B1 at the third position in the second direction (y direction) have been changed, the first width W1 in the first direction (x direction) and the second width W2 in the second direction (y direction) may be substantially the same as the first width W1 and the second width W2 of the semiconductor device 100a of FIG. 2A.

Figure 4:
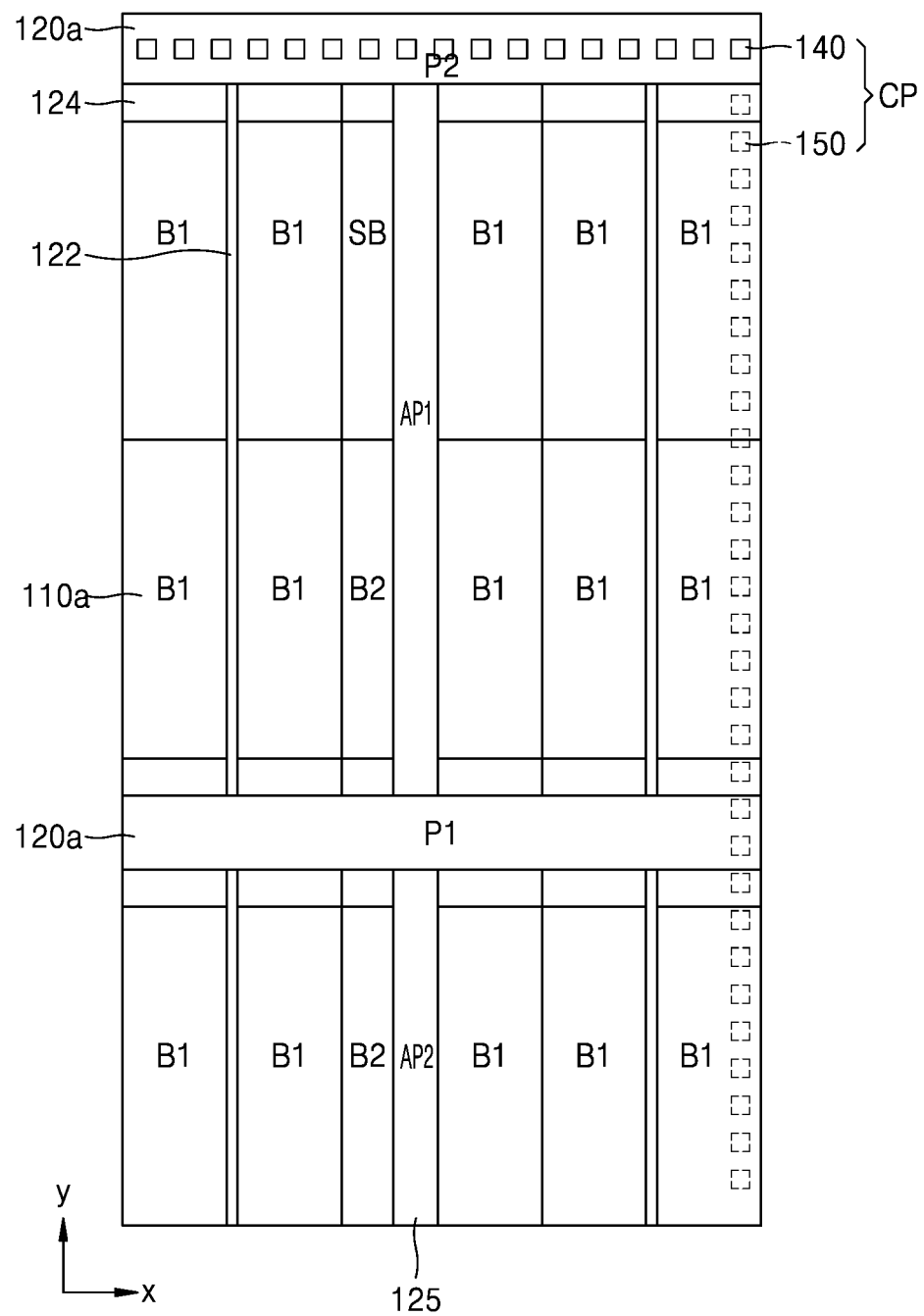
FIG. 4 is a plan view of a semiconductor device including a pad structure according to an embodiment of the inventive concept.

FIG. 4 is a plan view of the semiconductor device 100a including a pad structure according to an embodiment of the inventive concept. The description of components of the present embodiment that are the same as those described with reference to FIGS. 1A to 3B will be omitted or briefly presented.

Referring to FIG. 4, the semiconductor device 100a may include chip pads CP in an "L" shape. The chip pads CP may include first pads 140 for a package and second pads 150 for a test. The first pads 140 may correspond to pads connected to a wire when the semiconductor device 100a is mounted on a package substrate (refer to 200 of FIG. 8A) through wire bonding. The second pads 150 may be pads used to test whether the semiconductor device 100a is normal, and may be pads that are not used after the test.

The first pads 140 may be arranged in the second peripheral area P2 and may be arranged in the first direction (x direction). In FIG. 4, although the first pads 140 are arranged in one row in the first direction (x direction), the first pads 140 may be arranged in two or more rows. Although not distinguished in FIG. 4, the first pads 140 may be classified into data pads, command pads, power/ground pads, or the like. Herein, data may be transmitted through the data pads, a command may transmitted through the command pads, and power and a ground voltage may be applied through the power/ground pads. In general, the data pads and the power/ground pads may be arranged at both (e.g., opposite) outer sides of the second peripheral area P2, and the command pads may be arranged at the center of the second peripheral area P2. However, the positions of the data pads, the command pads, and the power/ground pads are not limited to the above-described positions.

The second pads 150 may be arranged in a side portion adjacent to the second peripheral area P2. For example, the second pads 150 may be arranged in a right side portion adjacent to the second peripheral area P2 (when viewed in a plan view) and may be arranged in the second direction (y direction). However, the inventive concept is not limited thereto, and the second pads 150 may be arranged on a left side portion adjacent to the second peripheral area P2. Due to the functions of the second pads 150, the second pads 150 may be arranged on a side portion facing or parallel to the second peripheral area P2. However, in the case of such a pad structure, a chip pad may deviate from the "L" shape.

The semiconductor device 100a of the present embodiment may be the semiconductor device 100a of FIG. 2A. Accordingly, in the semiconductor device 100a of the present embodiment, the peripheral area 120a may include the first peripheral area P1 and the second peripheral area P2, and the second peripheral area P2 may be arranged on the outermost side of the semiconductor device 100a in the second direction (y direction). In addition, the second core areas 124 of the first banks B1 at the third position in the second direction (y direction) may be arranged on an upper side of the first banks B1 at the third position in the second direction (y direction) and may be directly adjacent to the second peripheral area P2. However, the semiconductor device 100a of the present embodiment is not limited to the semiconductor device 100a of FIG. 2A. For example, the semiconductor device 100a of the present embodiment may be the semiconductor device 100 of FIG. 1A or the semiconductor device 100b of FIG. 3A.

As the semiconductor device 100a of the present embodiment includes the chip pad CP in an "L" shape, the number of pads available during chip testing may be increased, and packaging may also be easily performed according to the size of a semiconductor package required. For example, in the semiconductor device 100a of the present embodiment, as the first pads 140 used for packaging (e.g., for package operations and for connecting to the package substrate) are arranged on a short side portion where the second peripheral area P2 is arranged and the second pads 150 used for testing (e.g., prior to completion of the package fabrication) are arranged on a long side portion adjacent to the short side portion, the number of pads that may be used during chip testing may be increased, and because pads for packaging are driven on one side, the semiconductor device 100a may be easily arranged on the package substrate 200 according to the required size of the semiconductor package. A connection structure between the first pads 140 and the package substrate 200 will be described in more detail below with reference to FIGS. 8A to 10B.

Figure 5A:
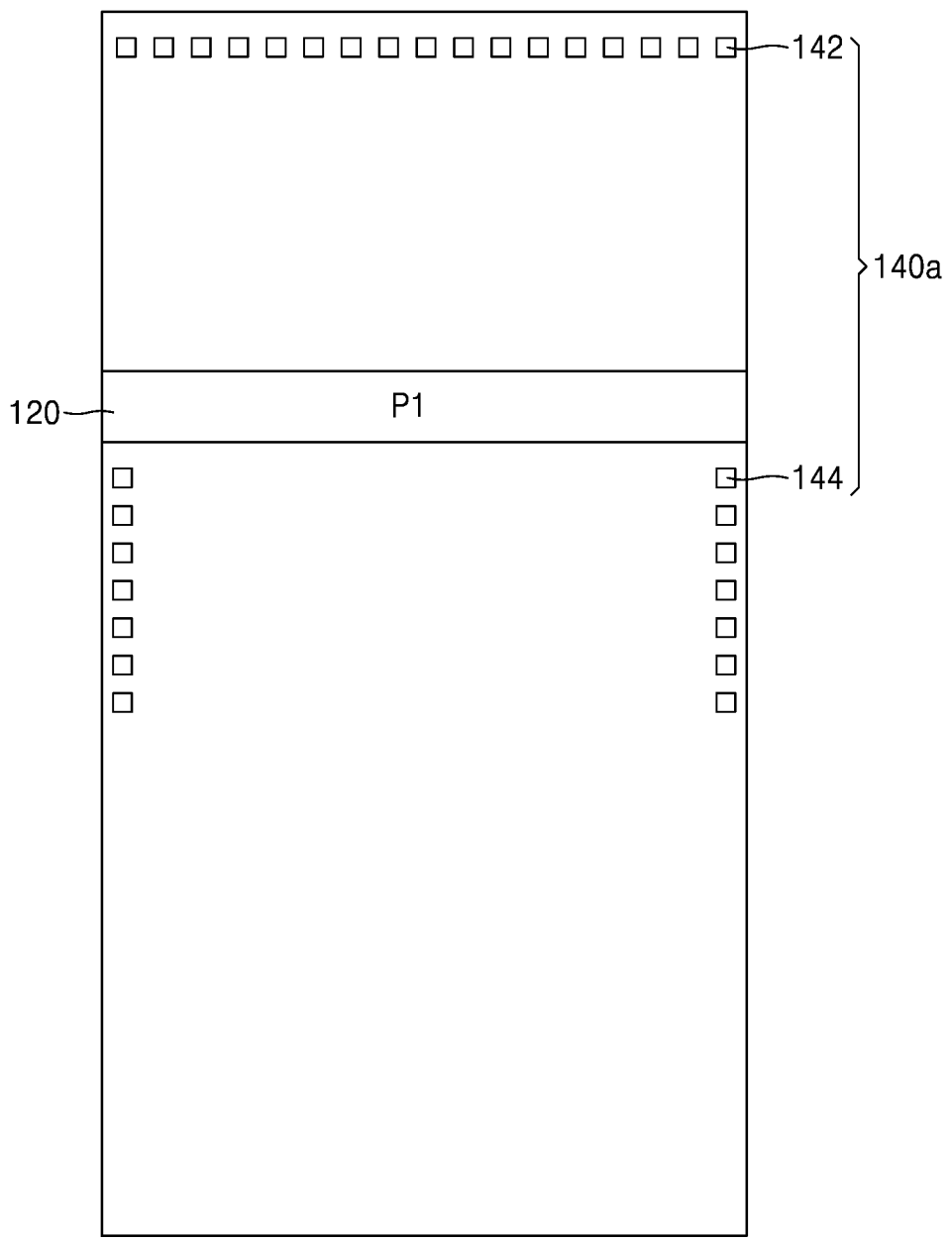
FIGS. 5A, 5B, 6A, 6B, 7A, and 7B are plan views of semiconductor devices including pad structures and structures of lines connected to pads, according to embodiments of the inventive concept.
Figure 5B:
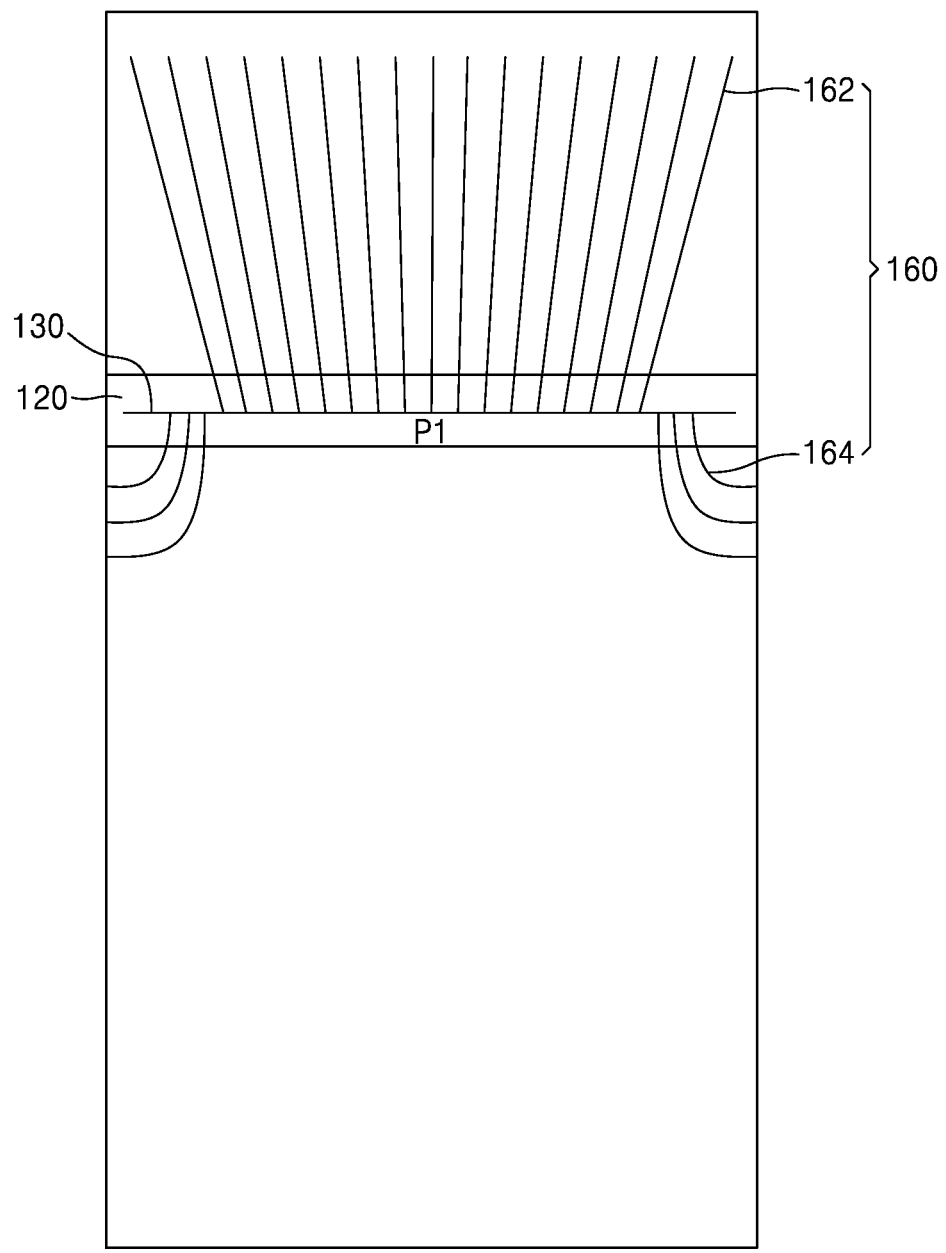
Figure 6A:
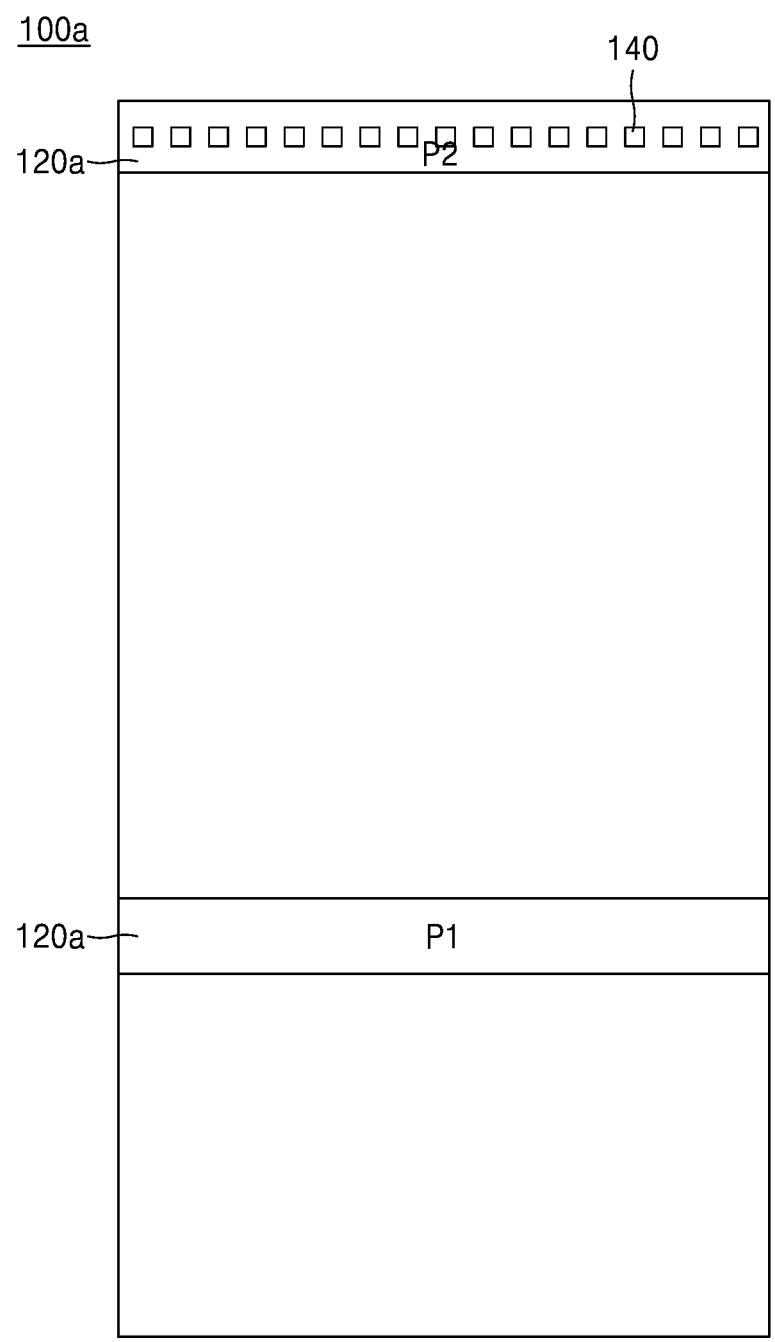
Figure 6B:
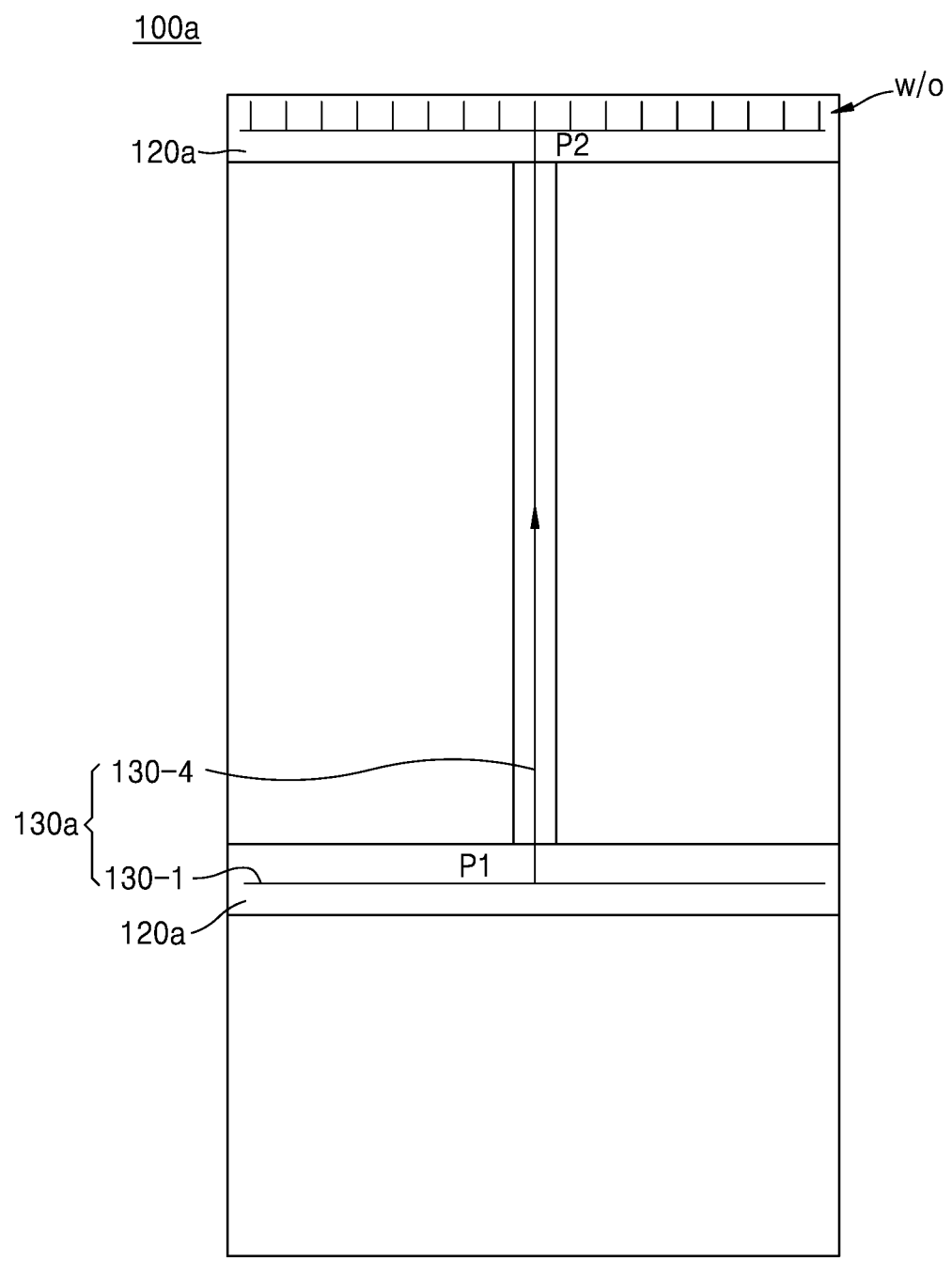

FIGS. 5A to 7B are plan views of semiconductor devices including pad structures and structures of lines connected to pads, according to an embodiment of the inventive concept, wherein FIGS. 5A and 5B may correspond to the semiconductor device 100 of FIG. 1A, and FIGS. 6A and 6B may correspond to the semiconductor device 100a of FIG. 2A. The description of components of the present embodiment that are the same as those described with reference to FIGS. 1A to 4 will be omitted or briefly presented.

Referring to FIGS. 5A and 5B, the semiconductor device 100 may include first pads 140a for a package. For example, the first pads 140a may be at a surface of the semiconductor device 100 (e.g., a surface of a semiconductor chip), such that the first pads connect to a bump, pillar, or other interconnection connection terminal that connects to a package substrate of the package. As used herein, the term "semiconductor device" may refer to a semiconductor chip or stack of chips, or may also refer generally to a semiconductor package, depending on the context. The first pads 140a may include a first set of pads 142 arranged on a short side of the semiconductor device 100 and a second set of pads 144 arranged on a long side of the semiconductor device 100. For example, the first set of pads 142 may be command pads, and the second set of pads 144 may be data pads. One or more power/ground pads may be included in at least one of the first set of pads 142 and the second set of pads 144. As can be seen, the semiconductor device 100 of FIGS. 5A and 5B may correspond to a form in which the semiconductor device 100 of FIG. 1A is rotated 180°.

As shown in FIG. 5B, the semiconductor device 100 of the present embodiment may have a structure including the first pads 140a shown in FIG. 5A, and may include redistribution lines 160 connecting the line 130 in the peripheral area 120, for example, the first line 130-1, to the first pads 140a. The redistribution lines 160 may include first redistribution lines 162 and second redistribution lines 164. The first redistribution lines 162 may connect the line 130 in the peripheral area 120 to the first partial pads 142, and the second redistribution lines may connect the line 130 in the peripheral area 120 to the second partial pads 144. The redistribution lines may be in the form of a metal or other conductive material that extends horizontally, parallel to a surface of a chip substrate of the semiconductor device 100.

Referring to FIGS. 6A and 6B, the semiconductor device 100a may include first pads 140 for a package. For example, the first pads 140 may be at a surface of the semiconductor device 100a (e.g., a surface of a semiconductor chip), such that the first pads connect to a bump, pillar, or other interconnection connection terminal that connects to a package substrate of the package. The first pads 140 may be arranged in the second peripheral area P2 of the semiconductor device 100a and extend in the first direction (x direction). Although not shown separately, the first pads 140 may include data pads, command pads, and power/ground pads. For example, the data pads and the power/ground pads may be arranged at both outer sides of the second peripheral area P2 (with respect to the first direction), and the command pads may be arranged at the center of the second peripheral area P2.

As shown in FIG. 6B, the semiconductor device 100a of the present embodiment may have a structure including the first pads 140 and may not include a separate redistribution line. For example, the first line 130-1 in the second peripheral area P2, which only extends in one horizontal direction (e.g., the x-direction) may vertically overlap and may be directly connected to the first pads 140 without a separate redistribution line extending horizontally to connect it to the first pads 140. The first line 130-1 in the second peripheral area P2 may also be connected to the first pads 140 only through vertically aligned conductive components (e.g., conductive plugs), and without any horizontally-extending redistribution lines. In addition, the first line 130-1 in the first peripheral area P1 may be connected to the first line 130-1 in the second peripheral area P2 through the fourth line 130-4, and the first line 130-1 in the second peripheral area P2 may be directly connected to the first pads 140, or connected only through vertically aligned conductive components (e.g., conductive plugs) without the use of a separate horizontal redistribution line.

Figure 7A:
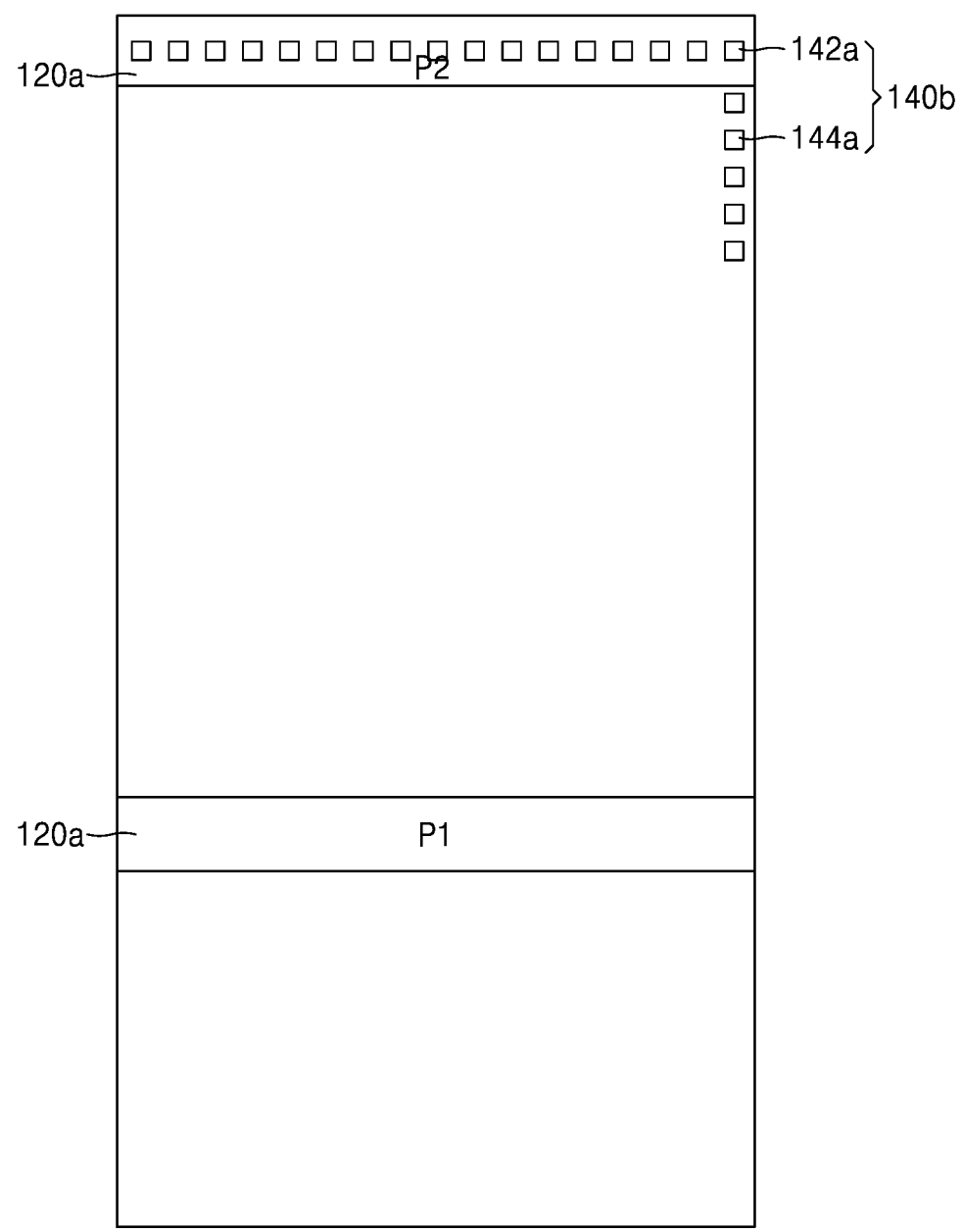
Figure 7B:
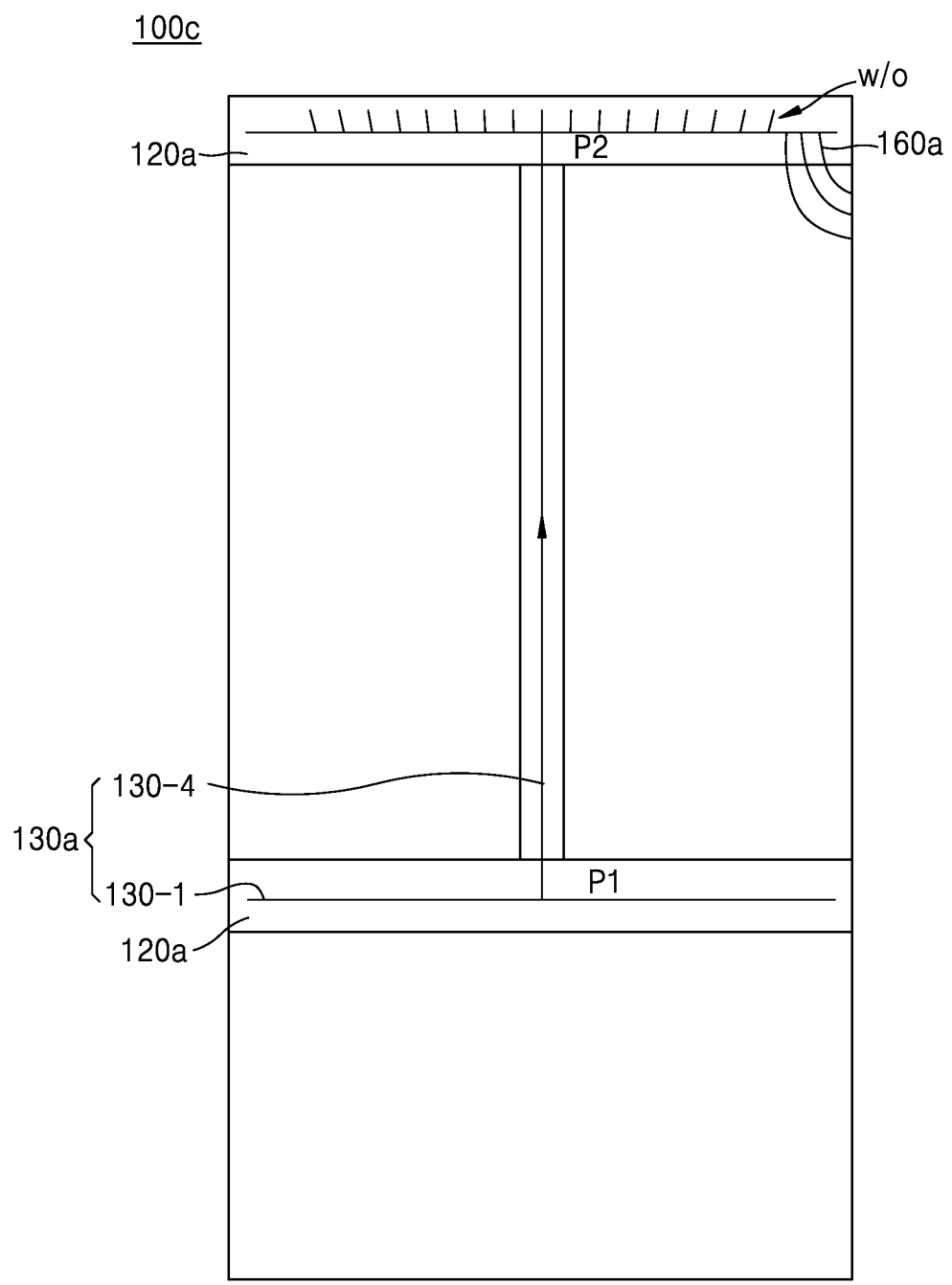

Referring to FIGS. 7A and 7B, a semiconductor device 100c may include first pads 140b for a package. For example, the first pads 140b may be at a surface of the semiconductor device 100c (e.g., a surface of a semiconductor chip), such that the first pads connect to a bump, pillar, or other interconnection connection terminal that connects to a package substrate of the package. The first pads 140b may include a first set of pads 142a arranged on a short side of the semiconductor device 100c and a second set of pads 144a arranged on a long side of the semiconductor device 100c. For example, the first set of pads 142a may include data pads and command pads, and the second set of pads 144a may include power/ground pads. However, the types of the first set of pads 142a and the second set of pads 144a are not limited to the above-described pads.

As shown in FIG. 7B, the semiconductor device 100c of the present embodiment may have a structure including the first pads 140b and may include redistribution lines 160a connecting a portion of the first line 130-1 in the second peripheral area P2 to the second set of pads 144a. A portion of the first line 130-1 in the second peripheral area P2 may vertically overlap with, and may be directly connected to (or connected through only vertically-aligned components) the first set of pads 142a without a redistribution line. In addition, the first line 130-1 in the first peripheral area P1 may be connected to the first line 130-1 in the second peripheral area P2 through the fourth line 130-4. In addition, a portion of the first line 130-1 in the second peripheral area P2 may be connected to the second set of pads 144a through the redistributions 160a, and a remaining portion of the first line 130-1 in the second peripheral area P2 may be directly connected to the first partial pads 142a or connected only through vertically-aligned components, without a horizontally-extending redistribution line.

In the semiconductor device 100c of the present embodiment, except for an arrangement structure of the first pads 140b, the structure of the banks B1 and B2 in the cell area 110a and the structure of the peripheral area 120a may be substantially the same as the semiconductor device 100a of FIG. 2A. Accordingly, in the semiconductor device 100c of the present embodiment, the peripheral area 120a may include the first peripheral area P1 and the second peripheral area P2, and the second peripheral area P2 may be arranged on the outermost side of the semiconductor device 100c in the second direction (y direction). In addition, the second core areas 124 of the first banks B1 at the third position in the second direction (y direction) may be arranged on an upper side of the first banks B1 at the third position in the second direction (y direction) and may be directly adjacent to the second peripheral area P2.

Figure 8A:
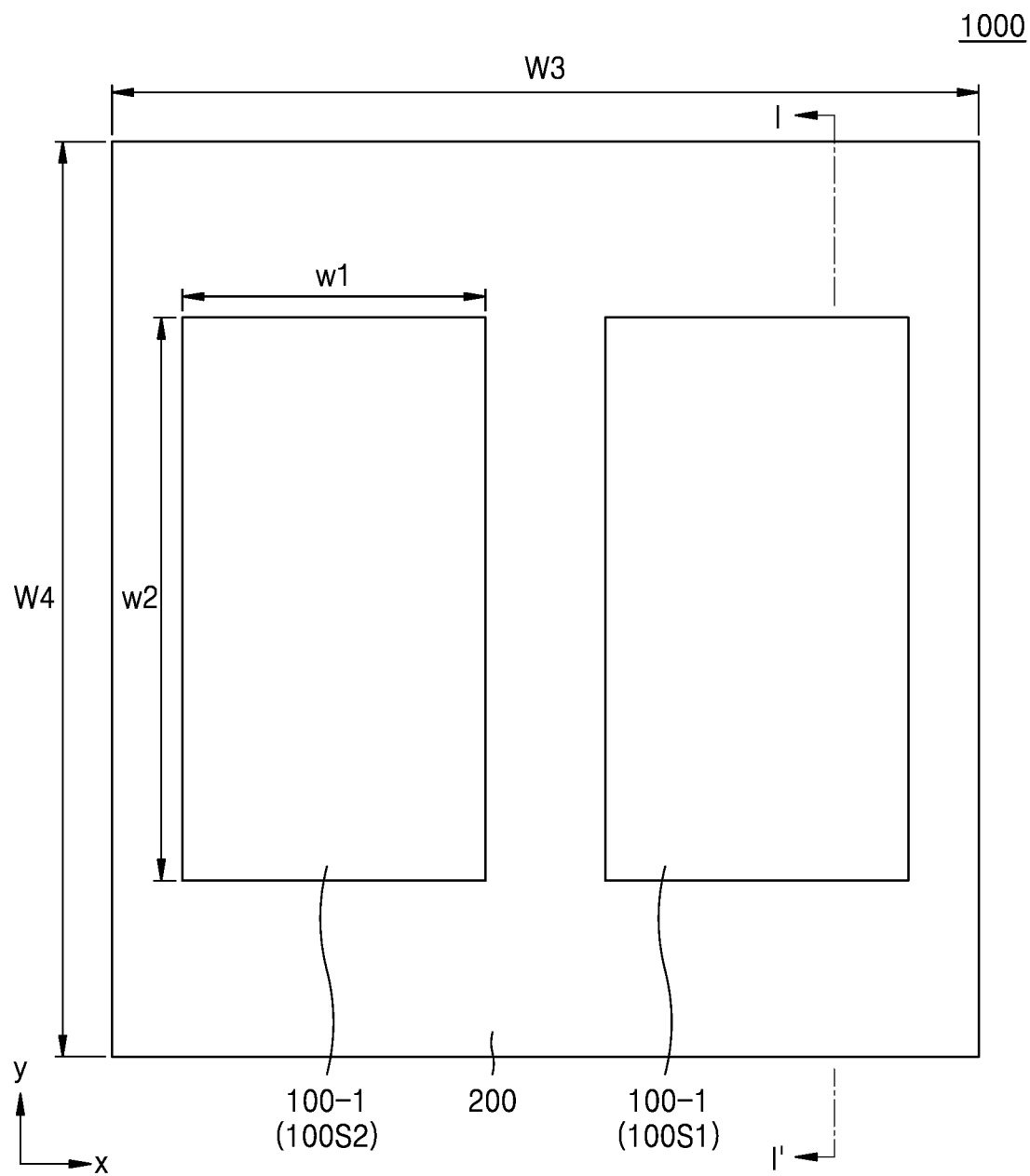
FIGS. 8A and 8B are respectively a plan view and a cross-sectional view of a semiconductor package according to an embodiment of the inventive concept.
Figure 8B:
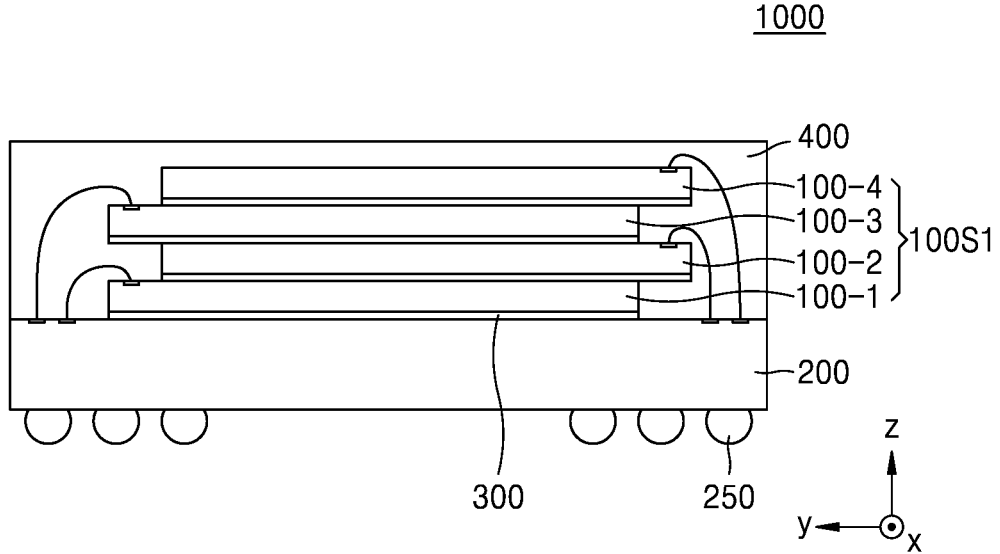

FIGS. 8A and 8B are respectively a plan view and a cross-sectional view of a semiconductor package according to an embodiment of the inventive concept, wherein FIG. 8A shows only a first semiconductor chip 100-1 at the lowermost portion of each of stacked structures without a sealing material, and FIG. 8B shows a portion taken along I-I'. The description of components of the present embodiment that are the same as those described with reference to FIGS. 1A to 7B will be omitted or briefly presented.

Referring to FIGS. 8A and 8B, a semiconductor package 1000 of the present embodiment may include the package substrate 200, stacked structures 100S1 and 100S2, an adhesive layer 300, and a sealing material 400.

The package substrate 200 is a support substrate on which the stacked structures 100S1 and 100S2 are mounted, and may include at least one layer of lines therein. When the lines are formed in multiple layers, the lines of different layers may be connected to each other through vertical contacts. According to an embodiment, the package substrate 200 may include through electrodes that are directly connected to pads on the upper and lower surfaces. Although not illustrated in drawings, protective layers such as solder resists or the like may be formed on an upper surface and a lower surface of the package substrate 200. The pads may be connected to lines of line layers and may be exposed from the protective layer. The package substrate 200 may be formed based on, for example, a ceramic substrate, a printed circuit board (PCB), an organic substrate, an interposer substrate, or the like. According to an embodiment, the package substrate 200 may include an active wafer such as a silicon wafer.

As shown in FIG. 8B, external connection terminals 250 such as a bump or a solder ball may be arranged on a lower surface of the package substrate 200. The external connection terminals 250 may mount the semiconductor package 1000 on an external system substrate or a main board. The external connection terminals 250 may be formed as multiple layers or a single layer. For example, when the external connection terminals 250 are formed as multiple layers, the external connection terminals 250 may include a copper pillar and a solder. When the external connection terminals 250 are formed as a single layer, the external connection members 250 may include a tin-silver solder or copper.

The semiconductor package 1000 of the present embodiment may satisfy the JEDEC standard for a semiconductor package including a DRAM device. Accordingly, the package substrate 200 may have a third width W3 in the first direction (x direction) and a fourth width W4 in the second direction (y direction). For example, the third width W3 may be 12.4 mm, and the fourth width W4 is may be 14 mm.

The stacked structures 100S1 and 100S2 may include a first stacked structure 100S1 and a second stacked structure 100S2. The first stacked structure 100S1 and the second stacked structure 100S2 may be arranged on the package substrate 200 to be adjacent to each other in the first direction (x direction). In some embodiments, the structures of the first stacked structure 100S1 and the second stacked structure 100S2 are substantially the same. Therefore, hereinafter, the first stacked structure 100S1 will be mainly described below.

The first stacked structure 100S1 may include first to fourth semiconductor chips 100-1 to 100-4 which are sequentially stacked. The first to fourth semiconductor chips 100-1 to 100-4 may be, for example, the semiconductor device 100a of FIG. 2A. However, the inventive concept is not limited thereto, and each of the first to fourth semiconductor chips 100-1 to 100-4 may be the semiconductor devices 100, 100b, and 100c of FIGS. 1A, 3A, and 7A.

Each of the first to fourth semiconductor chips 100-1 to 100-4 may be adhered to and stacked on the package substrate 200 or a corresponding semiconductor chip thereunder through the adhesive layer 300. The adhesive layer 300 may include, for example, a die attach film (DAF). However, a material of the adhesive layer 300 is not limited to a DAF. The first stacked structure 100S1 may have various shapes according to a stacked structure of the first to fourth semiconductor chips 100-1 to 100-4. The stacked structure of the first stacked structure 100S1 will be described in more detail with reference to FIGS. 9A to 10B.

The sealing material 400 may cover the stacked structures 100S1 and 100S2 on the package substrate 200. The sealing material 400 may protect the stacked structures 100S1 and 100S2 from external physical and chemical damages by sealing the stacked structures 100S1 and 100S2. The sealing material 400 may include, for example, an epoxy-based material, a thermosetting material, an ultraviolet (UV) curable material, or the like. In addition, the sealing material 400 may include a resin and contain a filler. As shown in FIG. 8B, the sealing material 400 may have a structure covering upper surfaces of the stacked structures 100S1 and 100S2. However, the inventive concept is not limited thereto, and the sealing material 400 may also have a structure that does not cover the upper surfaces of the stacked structures 100S1 and 100S2. For example, an upper surface of the fourth semiconductor chip 100-4 may be exposed from the sealing material 400. The sealing material 400 may be referred to as an encapsulant, or a mold layer.

In the semiconductor package 1000 of some embodiments, the number of semiconductor chips forming each of the stacked structures 100S1 and 100S2 is not limited to four. For example, each of the stacked structures 100S1 and 100S2 may include one to three or at least five semiconductor chips. For reference, in the semiconductor package 1000 of the present embodiment and some other embodiments, when each of the first to fourth semiconductor chips 100-1 to 100-4 of the stacked structures 100S1 and 100S2 is the semiconductor device 100a of FIG. 2A, the semiconductor device 100a has a memory capacity of 16 Gb, and the semiconductor package 1000 has a memory capacity of 16 GB, that is 128 Gb, eight semiconductor chips may be arranged on the package substrate 200, and each of the stacked structures 100S1 and 100S2 may have four semiconductor chips. In addition, when the semiconductor package 1000 has a capacity of 8 GB, that is, 64 Gb, four semiconductor chips may be arranged on the package substrate 200, and each of the stacked structures 100S1 and 100S2 may include two semiconductor chips.

In the semiconductor package 1000 of the present embodiment, the first to fourth semiconductor chips 100-1 to 100-4 of each of the stacked structures 100S1 and 100S2 may be stacked to expose pads. Accordingly, the thickness of the adhesive layer 300 adhering the first to fourth semiconductor chips 100-1 to 100-4 to the package substrate 200 or a corresponding semiconductor chip thereunder may be minimized. Therefore, an overall thickness of the semiconductor package 1000 may be minimized. For example, the overall thickness of the semiconductor package 1000 may be 0.7 mm or less, and the thickness of the adhesive layer 300 may be 0.01 mm or less. According to an embodiment, the semiconductor package 1000 may have a thickness of 0.67 mm or less by adjusting the thickness of at least one of the first to fourth semiconductor chips 100-1 to 100-4, the package substrate 200, and the sealing material 400.

FIGS. 9A to 10B are plan views each illustrating a structure in which semiconductor chips are stacked in various ways in the semiconductor package 1000 of FIG. 8A, wherein, in FIGS. 9A to 10B, only semiconductor chips are shown, and a package substrate, and a sealing material, or the like are omitted. FIGS. 9A to 10B will be described with reference to FIGS. 8A and 8B. The description of components of the present embodiment that are the same as those described with reference to FIGS. 1A to 8B will be omitted or briefly presented.

Figure 9A:
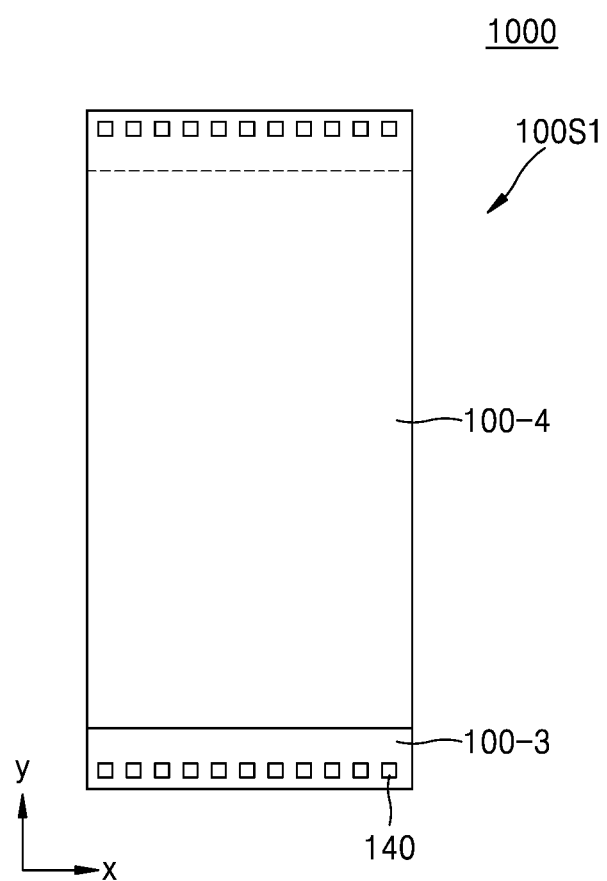
FIGS. 9A, 9B, 10A, and 10B are plan views each illustrating a structure in which semiconductor chips are variously stacked in the semiconductor package of FIG. 8A.

Referring to FIG. 9A, the semiconductor package 1000 may be the semiconductor package 1000 of FIG. 8A. In the semiconductor package 1000 of the present embodiment, the first stacked structure 100S1 may have a structure in which the first to fourth semiconductor chips 100-1 to 100-4 are stacked in a zigzag shape in the second direction (y direction). In addition, the first pads 140 of the first to fourth semiconductor chips 100-1 to 100-4 may be alternately arranged upward or downward in the second direction (y direction). In more detail, the first semiconductor chip 100-1 may protrude downward in the second direction (y direction), and the first pads 140 of the first semiconductor chip 100-1 may be arranged in a short side portion downward in the second direction (y direction). The second semiconductor chip 100-2 may protrude upward in the second direction (y direction), and the first pads 140 of the first semiconductor chip 100-2 may be arranged in the short side portion upward in the second direction (y direction). Subsequently, the third semiconductor chip 100-3 may protrude downward in the second direction (y direction), and the first pads of the third semiconductor chip 100-3 may be arranged in the short side portion downward in the second direction (y direction). The fourth semiconductor chip 100-4 may protrude upward in the second direction (y direction), and the first pads 140 of the fourth semiconductor chip 100-4 may be arranged in the short side portion upward in the second direction (y direction). "Upward" and "downward" as used to describe this embodiment and the embodiments of FIGS. 9B, 10A, and 10B, refer to a direction when viewed in a plan view. For reference, in the case of FIG. 9A, only the third semiconductor chip 100-3 and the fourth semiconductor chip 100-4 are shown due to a zigzag stacked structure of the first stacked structure 100S1. In this embodiment, semiconductor chips such as described in connection with FIGS. 2A and 6A may be used, with alternating adjacent semiconductor chips rotated 180 degrees.

Figure 9B:
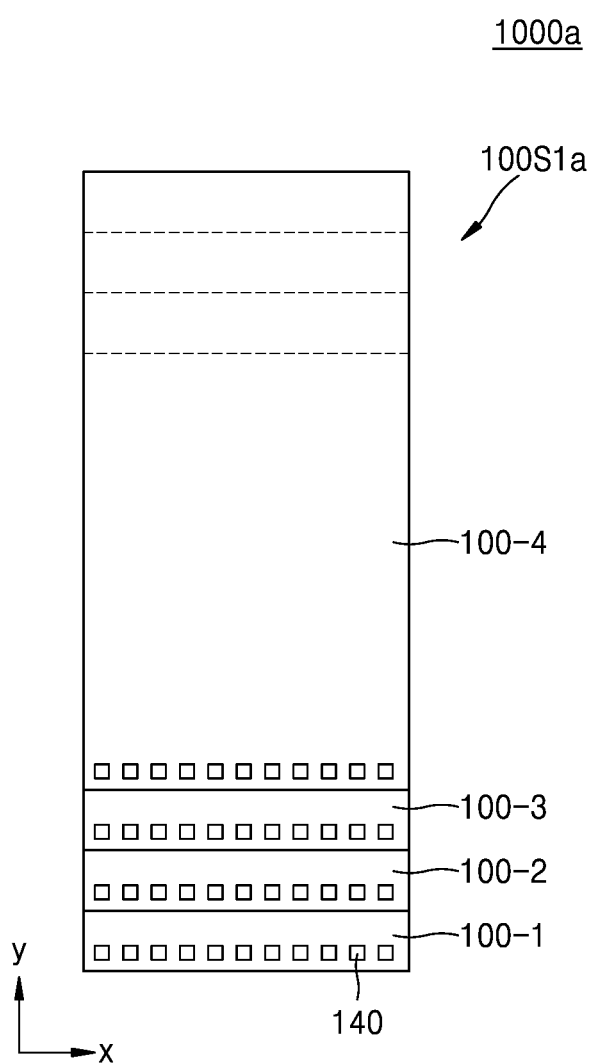

Referring to FIG. 9B, a first stacked structure 100S1a of a semiconductor package 1000a may include the first to fourth semiconductor chips 100-1 to 100-4 of the semiconductor device 100a of FIG. 2A or 6A. In the semiconductor package 1000a of the present embodiment, the first stacked structure 100S1a may have a structure in which the first to fourth semiconductor chips 100-1 to 100-4 are stacked in a staircase shape in the second direction (y direction). In addition, the first pads 140 of the first to fourth semiconductor chips 100-1 to 100-4 may be only arranged downward in the second direction (y direction). In more detail, the first to fourth semiconductor chips 100-1 to 100-4 may have a staircase shape that sequentially protrudes downward in the second direction (y direction), and all of the first pads 140 of each of the first to fourth semiconductor chips 100-1 to 100-4 may be arranged in a short side portion downward in the second direction (y direction).

Figure 10A:
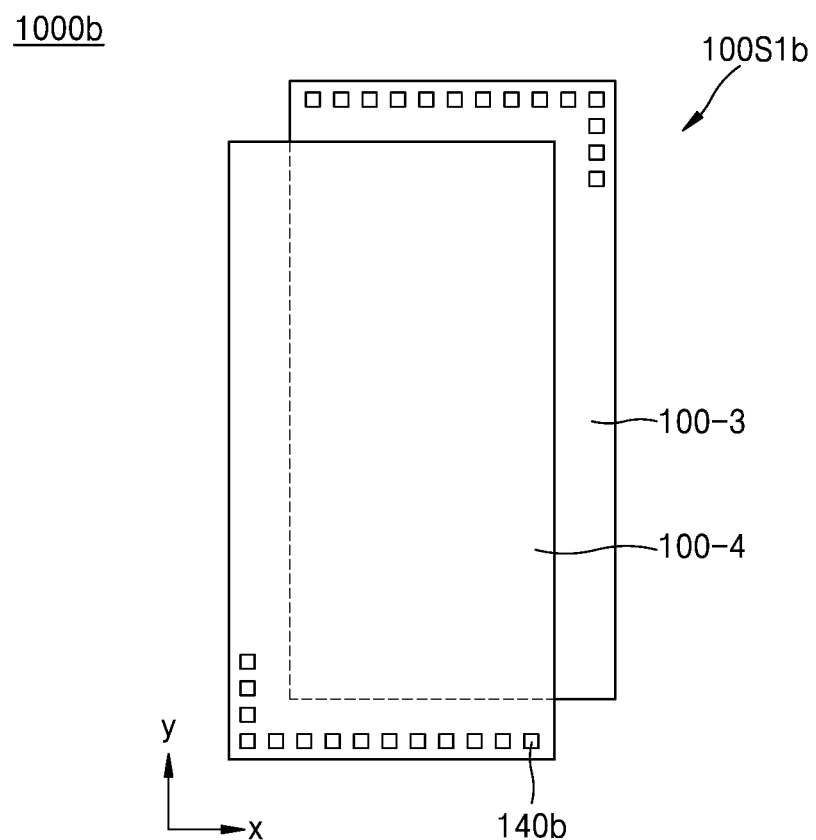

Referring to FIG. 10A, a first stacked structure 100S1b of a semiconductor package 1000b may include the first to fourth semiconductor chips 100-1 to 100-4 of the semiconductor device 100c of FIG. 7A. In the semiconductor package 1000b of the present embodiment, the first stacked structure 100S1b may have a structure in which the first to fourth semiconductor chips 100-1 to 100-4 are stacked in a zigzag shape in a diagonal direction. In addition, the first pads 140 of the first to fourth semiconductor chips 100-1 to 100-4 may be alternately arranged upward and downward in the diagonal direction. In more detail, the first semiconductor chip 100-1 may protrude upward in the diagonal direction, and the first pads 140 of the first semiconductor chip 100-1 may be arranged on a short side and a portion of a long side upward in the diagonal direction. The second semiconductor chip 100-2 may protrude downward in the diagonal direction, and the first pads 140 of the second semiconductor chip 100-2 may be arranged on a short side and a portion of a long side downward in the diagonal direction. Subsequently, the third semiconductor chip 100-3 may protrude upward in the diagonal direction, and the first pads 140 of the third semiconductor chip 100-3 may be arranged on the short side and a portion of the long side upward in the diagonal direction. The fourth semiconductor chip 100-4 may protrude downward in the diagonal direction, and the first pads 140 of the fourth semiconductor chip 100-4 may be arranged on the short side and a portion of the long side downward in the diagonal direction. For reference, in the case of FIG. 10A, only the third semiconductor chip 100-3 and the fourth semiconductor chip 100-4 are shown due to a zigzag stacked structure of the first stacked structure 100S1b.

Figure 10B:
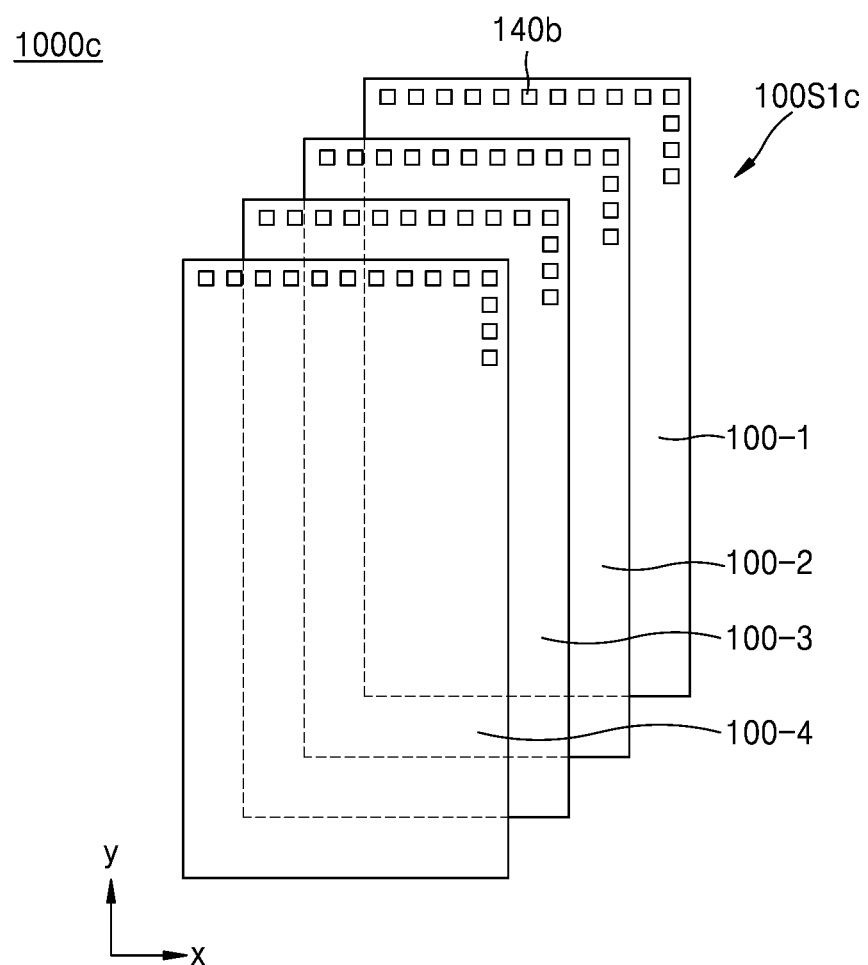

Referring to FIG. 10B, a first stacked structure 100S1c of a semiconductor package 1000c may include the first to fourth semiconductor chips 100-1 to 100-4 of the semiconductor device 100c of FIG. 7A. In the semiconductor package 1000c of the present embodiment, the first stacked structure 100S1c may have a structure in which the first to fourth semiconductor chips 100-1 to 100-4 are stacked in a staircase shape in a diagonal direction. In addition, the first pads 140 of the first to fourth semiconductor chips 100-1 to 100-4 may be arranged only upward in the diagonal direction. In more detail, the first to fourth semiconductor chips 100-1 to 100-4 may have a staircase shape that sequentially protrudes upward in the diagonal direction, and all of the first pads 140 of each of the first to fourth semiconductor chips 100-1 to 100-4 may be arranged on a short side and a portion of a long side upward in the diagonal direction.

While the inventive concept has been particularly shown and described with reference to embodiments thereof, it will be understood that various changes in form and details may be made therein without departing from the spirit and scope of the following claims.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

What is claimed is:

1. A semiconductor device comprising:
   a cell area in which a plurality of memory cells are arranged in an array structure;
   at least two peripheral areas in which circuits configured to drive the memory cells are arranged, the at least two peripheral areas being arranged next to the cell area,
   wherein:
   the cell area is divided into a plurality of banks,
   the plurality of banks comprise first banks having a first size and second banks having a size of $1/(2*n)$ (wherein n is an integer greater than or equal to 1) of the first size, and
   the at least two peripheral areas each extend in a first direction and are directly adjacent to the plurality of banks; and
   chip pads arranged in an "L" shape adjacent to an outer edge of a chip,
   wherein the semiconductor device has a shape of a rectangular chip which is elongated in a second direction perpendicular to the first direction.

2. The semiconductor device of claim 1, wherein:
   each of the second banks has a size of ½ of the first size,
   the cell area comprises fifteen first banks and two second banks,
   five first banks are arranged in each of three sequentially-arranged rows, each row extending in the first direction, and three first banks are arranged in each of five columns, each column extending in the second direction, and
   the two second banks are each arranged between two of the first banks in the first direction, wherein one of the two second banks is in a first row of the three sequentially-arranged rows, and another of the two second banks is in a second row of the three sequentially-arranged rows.

3. The semiconductor device of claim 2, wherein:
   the at least two peripheral areas comprise a first peripheral area and a second peripheral area,
   the first peripheral area is between the first row and the second row, the second peripheral area is outside the first banks in the second direction, and the plurality of banks in the second row and a plurality of banks in a third row of the three sequentially-arranged rows are between the first peripheral area and the second peripheral area.

4. The semiconductor device of claim 3, further comprising an additional peripheral area extending in the second direction and arranged between a set of the second banks and a set of the first banks in the first direction.

5. The semiconductor device of claim 2, wherein:
the two second banks are arranged to be aligned with each other in the second direction, and
an additional bank area is outside the two second banks or between the two second banks in the second direction.

6. The semiconductor device of claim 1, wherein:
the chip pads comprise first pads for a package operation and second pads for testing,
the first pads are arranged on a short side of the rectangular chip, and the second pads are arranged on a long side of the rectangular chip.

7. The semiconductor device of claim 6, wherein some of the first pads are arranged on the long side of the rectangular chip.

8. The semiconductor device of claim 1, wherein:
the rectangular chip has a size of less than or equal to 5.7 mm in the first direction and a size of less than or equal to 10.92 mm in the second direction, and
the semiconductor device has a memory capacity of 16 gigabits (Gb).

9. A semiconductor device comprising:
a cell area in which a plurality of memory cells are arranged in an array structure; and
a peripheral area in which circuits configured to drive the memory cells are arranged, the peripheral area being next to the cell area,
wherein:
the cell area is divided into a plurality of banks,
the plurality of banks comprise first banks having a base size and second banks having a size of $1/(2*n)$ (wherein n is an integer greater than or equal to 1) of the base size, the plurality of banks being arranged in a first direction and a second direction perpendicular to the first direction, and
the semiconductor device has a shape of a rectangular chip which is elongated in the second direction.

10. The semiconductor device of claim 9, wherein:
each of the second banks has a size of ½ of the base size,
the cell area comprises fifteen first banks and two second banks,
five first banks are arranged in each of three sequentially-arranged rows, each row extending in the first direction, and three first banks are arranged in each of five columns, each column extending in the second direction, and
the two second banks are each arranged between two of the first banks in the first direction, wherein one of the two second banks is in a first row of the three sequentially-arranged rows, and another of the two second banks is in a second row of the three sequentially-arranged rows.

11. The semiconductor device of claim 10, wherein:
the peripheral area comprises a first peripheral area and a second peripheral area,
each of the first peripheral area and the second peripheral area extends in the first direction, the first peripheral area is between the first row and the second row, and
the second peripheral area is at an outer portion of the rectangular chip in the second direction.

12. The semiconductor device of claim 9, further comprising chip pads arranged in an "L" shape at an outer portion of the rectangular chip.

13. The semiconductor device of claim 12, wherein:
the chip pads comprise first pads for a package operation and second pads for testing,
the first pads are arranged on a short side or the short side and a long side of the rectangular chip, and the second pads are arranged on the long side of the rectangular chip.

14. A semiconductor package comprising:
a package substrate;
a first stack structure in which a plurality of chips are stacked, the first stack structure being mounted on the package substrate;
a second stacked structure in which a same number of chips as that of the first stack structure are stacked, the second stacked structure being mounted on the package substrate and arranged to be horizontally adjacent to the first stacked structure; and
a sealing material sealing the first stacked structure and the second stacked structure on the package substrate,
wherein each of the plurality of chips comprises a cell area in which a plurality of memory cells are arranged in an array structure and a peripheral area in which circuits configured to drive the plurality of memory cells are arranged, the peripheral area being next to the cell area,
wherein the cell area is divided into a plurality of banks,
the plurality of banks comprise first banks having a base size and second banks having a size of $1/(2*n)$ (wherein n is an integer greater than or equal to 1) of the base size, the plurality of banks being arranged in a first direction and a second direction perpendicular to the first direction, and
each chip of the plurality of chips has a shape of a rectangular chip which is elongated in the second direction.

15. The semiconductor package of claim 14, wherein:
the package substrate is 12.4 mm or less in the first direction and 14 mm or less in the second direction, and
each chip of the plurality of chips has a capacity of 16 Gb.

16. The semiconductor package of claim 14, wherein:
each of the second banks has a size of ½ of the base size,
the cell area comprises fifteen first banks and two second banks,
five first banks are arranged in each of three sequentially-arranged rows, each row extending in the first direction, and three first banks are arranged in each of five columns, each column extending in the second direction, and
the two second banks are each arranged between two of the first banks in the first direction, wherein one of the two second banks is in a first row of the three sequentially-arranged rows, and another of the two second banks is in a second row of the three sequentially-arranged rows.

17. The semiconductor package of claim 16, wherein:
the peripheral area comprises a first peripheral area and a second peripheral area,
each of the first peripheral area and the second peripheral area extends in the first direction, the first peripheral area is arranged between the first row and the second row, and the second peripheral area is arranged at an outer portion of each of the plurality of chips in the second direction.

18. The semiconductor package of claim 14, further comprising a plurality of chip pads, wherein:

the plurality of chip pads are arranged in an "L" shape at an outer portion of each of the plurality of chips, and the chip pads comprise first pads for a package operation and second pads for a test.

19. The semiconductor package of claim 18, wherein:

a set of pads of the first pads are arranged on a short side or a short side and a long side of each of the plurality of chips, and a set of pads of the second pads are arranged on the long side of each of the plurality of chips.

20. The semiconductor package of claim 19, including one of the following:

a set of pads of the first pads are arranged on the short side of each of the plurality of chips, and the plurality of chips are stacked in a zigzag shape in the second direction, or, a set of pads of the first pads are arranged on the short side and the long side of each of the plurality of chips, and the plurality of chips are stacked in a zigzag shape in a diagonal direction in a form in which the first pads are exposed.

* * * * *